United States Patent
Mochida

(10) Patent No.: US 11,791,776 B2
(45) Date of Patent: Oct. 17, 2023

(54) DISTORTION COMPENSATION DEVICE, WIRELESS COMMUNICATOR, PREDISTORTER, DISTORTION COMPENSATION METHOD, AND COMPUTER PROGRAM

(71) Applicant: SUMITOMO ELECTRIC INDUSTRIES, LTD., Osaka (JP)

(72) Inventor: Eiji Mochida, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 463 days.

(21) Appl. No.: 17/271,008

(22) PCT Filed: Jul. 18, 2019

(86) PCT No.: PCT/JP2019/028200
§ 371 (c)(1),
(2) Date: Feb. 24, 2021

(87) PCT Pub. No.: WO2020/044831
PCT Pub. Date: Mar. 5, 2020

(65) Prior Publication Data
US 2021/0328553 A1    Oct. 21, 2021

(30) Foreign Application Priority Data
Aug. 29, 2018 (JP) .................................. 2018-160463

(51) Int. Cl.
*H03F 1/32* (2006.01)
*H03F 3/24* (2006.01)
*H04B 1/04* (2006.01)

(52) U.S. Cl.
CPC .............. *H03F 1/32* (2013.01); *H03F 3/245* (2013.01); *H04B 1/0475* (2013.01);
(Continued)

(58) Field of Classification Search
CPC ........................................................ H03F 1/32
(Continued)

(56) References Cited

U.S. PATENT DOCUMENTS 7,098,734 B2 * 8/2006 Hongo .................. H03F 1/3258
330/149
8,005,162 B2 * 8/2011 Cai .......................... H03F 3/24
375/296
(Continued)

FOREIGN PATENT DOCUMENTS

JP    2005-101908    4/2005
JP    2011-176686    9/2011
(Continued)

*Primary Examiner* — Henry Choe
(74) *Attorney, Agent, or Firm* — SMITH, GAMBRELL & RUSSELL, LLP.

(57) ABSTRACT

A distortion compensation device includes: a first distortion compensation circuit having a first distortion compensation characteristic for compensating for a first distortion occurring in an output of an amplifier, the first distortion compensation circuit being configured to compensate for the first distortion; a second distortion compensation circuit having a second distortion compensation characteristic for compensating for a second distortion occurring in the output of the amplifier, the second distortion compensation circuit being configured to compensate for the second distortion; and an update unit configured to update the second distortion compensation characteristic. The first distortion includes a nonlinear distortion and a memory effect distortion, the second distortion is a distortion whose temporal change is quicker than the first distortion, and the update unit updates the second distortion compensation characteristic at a higher frequency than an update frequency of the first distortion compensation characteristic.

8 Claims, 18 Drawing Sheets

(52) U.S. Cl.
CPC .. *H03F 2200/171* (2013.01); *H03F 2200/451* (2013.01); *H03F 2201/3209* (2013.01); *H04B 2001/0425* (2013.01)

(58) Field of Classification Search
USPC .......................................... 330/149; 375/297
See application file for complete search history.

(56) References Cited

U.S. PATENT DOCUMENTS

| | | | | |
|---|---|---|---|---|
| 8,259,843 | B2* | 9/2012 | Cai | ...................... H04B 1/0475 |
| | | | | 375/295 |
| 2005/0068102 | A1* | 3/2005 | Hongo | .................. H03F 1/3258 |
| | | | | 330/149 |
| 2013/0222059 | A1 | 8/2013 | Kilambi et al. | |
| 2021/0328553 | A1* | 10/2021 | Mochida | ................. H03F 3/245 |

FOREIGN PATENT DOCUMENTS

| | | |
|---|---|---|
| JP | 2013-247501 | 12/2013 |
| JP | 2014-204148 | 10/2014 |
| JP | 2017-046122 | 3/2017 |
| JP | 2017-212478 | 11/2017 |

\* cited by examiner

DISTORTION COMPENSATION DEVICE, WIRELESS COMMUNICATOR, PREDISTORTER, DISTORTION COMPENSATION METHOD, AND COMPUTER PROGRAM

TECHNICAL FIELD

The present invention relates to a distortion compensation device, a wireless communicator, a predistorter, a distortion compensation method, and a computer program. This application claims priority on Japanese Patent Application No. 2018-160463 filed on Aug. 29, 2018, the entire contents of which are incorporated herein by reference.

BACKGROUND ART

Amplifiers have non-linear characteristics. A distortion compensation technique is used for compensating for distortions in signals caused by the non-linear characteristics. An example of a distortion compensation technique is disclosed in PATENT LITERATURE 1.

CITATION LIST

Patent Literature

PATENT LITERATURE 1: Japanese Laid-Open Patent Publication No. 2014-204148

SUMMARY OF INVENTION

A distortion compensation device according to one mode of the present disclosure includes: a first distortion compensation circuit having a first distortion compensation characteristic for compensating for a first distortion occurring in an output of an amplifier, the first distortion compensation circuit being configured to compensate for the first distortion; a second distortion compensation circuit having a second distortion compensation characteristic for compensating for a second distortion occurring in the output of the amplifier, the second distortion compensation circuit being configured to compensate for the second distortion; and an update unit configured to update the second distortion compensation characteristic. The first distortion includes a non-linear distortion and a memory effect distortion, the second distortion is a distortion whose temporal change is quicker than the first distortion, and the update unit updates the second distortion compensation characteristic at a higher frequency than an update frequency of the first distortion compensation characteristic.

A wireless communicator according to one mode of the present disclosure includes: an amplifier configured to amplify a signal having a radio frequency; a first distortion compensation circuit having a first distortion compensation characteristic for compensating for a first distortion occurring in an output of the amplifier, the first distortion compensation circuit being configured to compensate for the first distortion; a second distortion compensation circuit having a second distortion compensation characteristic for compensating for a second distortion occurring in the output of the amplifier, the second distortion compensation circuit being configured to compensate for the second distortion; and an update unit configured to update the second distortion compensation characteristic. The first distortion includes a non-linear distortion and a memory effect distortion, the second distortion is a distortion whose temporal change is quicker than the first distortion, and the update unit updates the second distortion compensation characteristic at a higher frequency than an update frequency of the first distortion compensation characteristic.

A predistorter according to one mode of the present disclosure is connected to an external distortion compensation circuit configured to compensate for a first distortion occurring in an output of an amplifier. The predistorter includes: a distortion compensation circuit having a distortion compensation characteristic for compensating for, out of distortions occurring in the output of the amplifier, a second distortion different from the first distortion; and an update unit configured to update the distortion compensation characteristic. The first distortion includes a non-linear distortion and a memory effect distortion, the second distortion is a distortion whose temporal change is quicker than the first distortion, and the update unit updates the distortion compensation characteristic at a higher frequency than an update frequency of the external distortion compensation circuit.

A distortion compensation method according to one mode of the present disclosure includes the steps of: executing a first distortion compensation process of compensating for a first distortion occurring in an output of an amplifier; executing a second distortion compensation process of compensating for a second distortion occurring in the output of the amplifier; and executing, at a predetermined frequency, an update process of updating a second distortion compensation characteristic for compensating for the second distortion in the second distortion compensation process. The first distortion includes a non-linear distortion and a memory effect distortion, the second distortion is a distortion whose temporal change is quicker than the first distortion, and the predetermined frequency is a frequency higher than an update frequency of a first distortion compensation characteristic for compensating for the first distortion in the first distortion compensation process.

A distortion compensation method according to another mode of the present disclosure is to be executed by a predistorter connected to an external predistorter configured to compensate for a first distortion occurring in an output of an amplifier. The distortion compensation method includes the steps of: compensating for, out of distortions occurring in the output of the amplifier, a second distortion different from the first distortion; and executing, at a predetermined frequency, an update process of updating a second distortion compensation characteristic for compensating for the second distortion. The first distortion includes a non-linear distortion and a memory effect distortion, the second distortion is a distortion whose temporal change is quicker than the first distortion, and the predetermined frequency is a frequency higher than an update frequency of a first distortion compensation characteristic for compensating for the first distortion.

A computer program according to one mode of the present disclosure is for setting a first distortion compensation circuit having a first distortion compensation characteristic for compensating for a first distortion occurring in an output of an amplifier, the first distortion compensation circuit being configured to compensate for the first distortion, and a second distortion compensation circuit having a second distortion compensation characteristic for compensating for a second distortion occurring in the output of the amplifier, the second distortion compensation circuit being configured to compensate for the second distortion. The computer program causes a computer to execute at a predetermined frequency the steps of: calculating a parameter for setting the second distortion compensation characteristic; and setting the calculated parameter to the second distortion compensation circuit. The first distortion includes a non-linear distortion and a memory effect distortion, the second distortion is a distortion whose temporal change is quicker than the first distortion, and the predetermined frequency is a frequency higher than an update frequency of the first distortion compensation characteristic.

A computer program according to another mode of the present disclosure is for setting a second distortion compensation circuit connected to a first distortion compensation circuit configured to compensate for a first distortion occurring in an output of an amplifier. The computer program causes a computer to execute at a predetermined frequency the steps of: calculating a parameter for setting a distortion compensation characteristic of the second distortion compensation circuit; and setting the calculated parameter to the second distortion compensation circuit. The first distortion includes a non-linear distortion and a memory effect distortion, the second distortion compensation circuit is a circuit configured to compensate for a second distortion, the second distortion is a distortion whose temporal change is quicker than the first distortion, and the predetermined frequency is a frequency higher than an update frequency of a distortion compensation characteristic of the first distortion compensation circuit.

DESCRIPTION OF EMBODIMENTS

Figure 1:
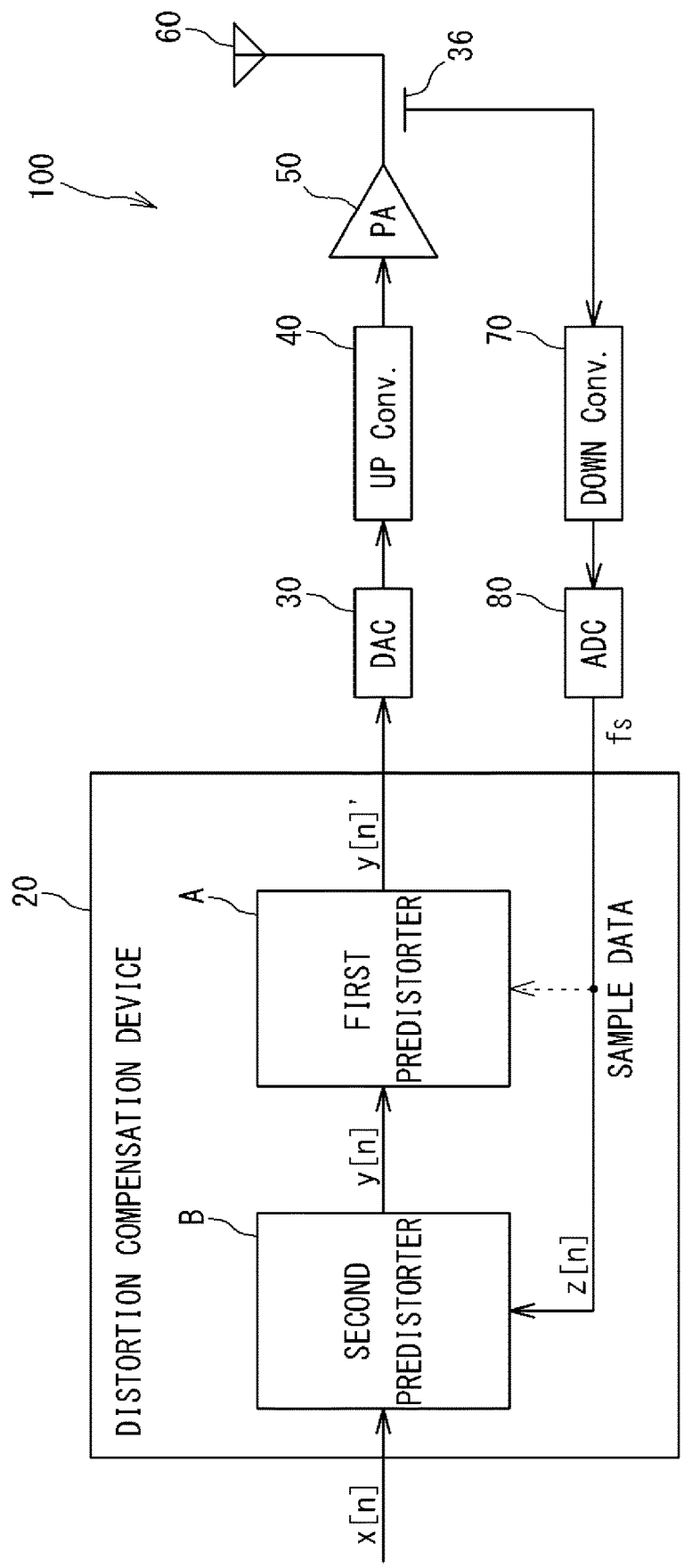
FIG. 1 is a configuration diagram of a wireless communicator including a distortion compensation device according to an embodiment.

Problems to be Solved by the Present Disclosure

An instantaneous change in distortion may occur, for example, in a compound semiconductor amplifier (GaN amplifier) formed from gallium nitride. In the GaN amplifier, a transient response called an Idq drift is present. The Idq drift is a transient response in which a drain current becomes lower than a set value when the amplifier transitions from the high power state to the power-off state. In the GaN amplifier, due to the Idq drift, a distortion instantaneously changes in response to signal power fluctuation. In particular, signal power fluctuation is likely to occur in a communication system in which transmission and reception are alternately performed, such as time division duplex (TDD), for example.

A change in distortion in an amplifier may sometimes be dealt with by updating distortion compensation coefficients, which are used in a distortion compensation device, in response to the change in the distortion, for example. By updating the distortion compensation coefficients, distortion compensation characteristics of the distortion compensation device are updated in response to the change in the distortion.

In order to follow an instantaneous change in distortion caused by an Idq drift or the like, it is considered to frequently perform update of the distortion compensation characteristics. However, since a processing load for updating the distortion compensation characteristics is great, it is not always easy to frequently perform update of the distortion compensation characteristics in preparation for a change in distortion.

Effects of the Present Disclosure

According to the present disclosure, it is possible to deal with a change in distortion.

Outline of the Embodiment of the Present Disclosure

Hereinafter, the outlines of embodiments of the present disclosure are listed and described.

(1) A distortion compensation device according to the present embodiment includes: a first distortion compensation circuit having a first distortion compensation characteristic for compensating for a first distortion occurring in an output of an amplifier, the first distortion compensation circuit being configured to compensate for the first distortion; a second distortion compensation circuit having a second distortion compensation characteristic for compensating for a second distortion occurring in the output of the amplifier, the second distortion compensation circuit being configured to compensate for the second distortion; and an update unit configured to update the second distortion compensation characteristic. The first distortion includes a nonlinear distortion and a memory effect distortion, the second distortion is a distortion whose temporal change is quicker than the first distortion, and the update unit updates the second distortion compensation characteristic at a higher frequency than an update frequency of the first distortion compensation characteristic. Accordingly, a temporal change in the second distortion can be dealt with. In addition, both of the non-linear distortion and the memory effect distortion included in the first distortion can be dealt with. Therefore, highly accurate distortion compensation can be realized. The "non-linear distortion" refers to a phenomenon in which an output signal having a waveform analogous to the waveform of an input signal cannot be obtained due to non-linear input/output characteristics of an amplifier. The "memory effect distortion" refers to a phenomenon in which an output signal having a waveform dependent not only on a present input signal but also on the history of past input signals is obtained. Further, to "update a second distortion compensation characteristic at a higher frequency than an update frequency of the first distortion compensation characteristic" includes not only a case where the first distortion compensation characteristic is updated at a specific frequency, but also a case where the first distortion compensation characteristic is not updated. That is, when the first distortion compensation characteristic is not updated, to update the second distortion compensation characteristic at an arbitrary frequency corresponds to "update the second distortion compensation characteristic at a higher frequency than the first distortion compensation characteristic".

(2) In the distortion compensation device according to the present embodiment, the second distortion may include at least one of the non-linear distortion and the memory effect distortion. Accordingly, also in the second distortion compensation circuit, both of the non-linear distortion and the memory effect distortion can be dealt with, and distortion compensation with still higher accuracy can be realized.

(3) In the distortion compensation device according to the present embodiment, the first distortion compensation characteristic may be specified by a first characteristic formula of a predetermined order, and the second distortion compensation characteristic may be specified by a second characteristic formula of an order lower than that of the first characteristic formula. Accordingly, even when update of the second distortion compensation characteristic is performed at a high frequency, the processing load can be suppressed.

(4) In the distortion compensation device according to the present embodiment, the first distortion compensation circuit may output an output signal having a first frequency bandwidth, and the second distortion compensation circuit may output an output signal having a second frequency bandwidth narrower than the first frequency bandwidth. In accordance with increase in the frequency bandwidth of the output signal, the processing load is increased. Therefore, when a second frequency bandwidth is set to be narrow, the processing load can be suppressed even when update of the second distortion compensation characteristic is performed at a high frequency.

(5) In the distortion compensation device according to the present embodiment, the update unit may include a first update unit configured to update the first distortion compensation characteristic, and a second update unit configured to update the second distortion compensation characteristic. The first update unit may update the first distortion compensation characteristic on the basis of a first monitoring signal obtained from the output signal of the amplifier, the second update unit may update the second distortion compensation characteristic on the basis of a second monitoring signal obtained from the output signal of the amplifier, and a frequency bandwidth of the second monitoring signal may be narrower than a frequency bandwidth of the first monitoring signal. Accordingly, the second distortion compensation characteristic can be appropriately updated by using the second monitoring signal for which a band not used in the distortion compensation by the second distortion compensation circuit is eliminated.

(6) A wireless communicator according to the present embodiment includes: an amplifier configured to amplify a signal having a radio frequency; a first distortion compensation circuit having a first distortion compensation characteristic for compensating for a first distortion occurring in an output of the amplifier, the first distortion compensation circuit being configured to compensate for the first distortion; a second distortion compensation circuit having a second distortion compensation characteristic for compensating for a second distortion occurring in the output of the amplifier, the second distortion compensation circuit being configured to compensate for the second distortion; and an update unit configured to update the second distortion compensation characteristic. The first distortion includes a non-linear distortion and a memory effect distortion, the second distortion is a distortion whose temporal change is quicker than the first distortion, and the update unit updates the second distortion compensation characteristic at a higher frequency than an update frequency of the first distortion compensation characteristic. Accordingly, a temporal change in the second distortion can be dealt with. In addition, both of the non-linear distortion and the memory effect distortion included in the first distortion can be dealt with. Therefore, highly accurate distortion compensation can be realized.

(7) The wireless communicator according to the present embodiment may further include: a first filter configured to convert a monitoring signal obtained from the output signal of the amplifier, to a first monitoring signal; and a second filter configured to convert the monitoring signal to a second monitoring signal whose frequency bandwidth is narrower than that of the first monitoring signal. The update unit may include a first update unit configured to update the first distortion compensation characteristic on the basis of the first monitoring signal outputted from the first filter, and a second update unit configured to update the second distortion compensation characteristic on the basis of the second monitoring signal outputted from the second filter. Accordingly, the second distortion compensation characteristic can be appropriately updated by using the second monitoring signal for which a band not used in the distortion compensation by the second distortion compensation circuit is eliminated.

(8) A predistorter according to the present embodiment is connected to an external distortion compensation circuit configured to compensate for a first distortion occurring in an output of an amplifier. The predistorter includes: a distortion compensation circuit having a distortion compensation characteristic for compensating for, out of distortions occurring in the output of the amplifier, a second distortion different from the first distortion; and an update unit configured to update the distortion compensation characteristic. The first distortion includes a non-linear distortion and a memory effect distortion, the second distortion is a distortion whose temporal change is quicker than the first distortion, and the update unit updates the distortion compensation characteristic at a higher frequency than an update frequency of the external distortion compensation circuit. Accordingly, a temporal change in the second distortion can be dealt with. In addition, both of the non-linear distortion and the memory effect distortion included in the first distortion can be dealt with. Therefore, highly accurate distortion compensation can be realized.

(9) A distortion compensation method according to the present embodiment includes the steps of: executing a first distortion compensation process of compensating for a first distortion occurring in an output of an amplifier; executing a second distortion compensation process of compensating for a second distortion occurring in the output of the amplifier; and executing, at a predetermined frequency, an update process of updating a second distortion compensation characteristic for compensating for the second distortion in the second distortion compensation process. The first distortion includes a non-linear distortion and a memory effect distortion, the second distortion is a distortion whose temporal change is quicker than the first distortion, and the predetermined frequency is a frequency higher than an update frequency of a first distortion compensation characteristic for compensating for the first distortion in the first distortion compensation process. Accordingly, a temporal change in the second distortion can be dealt with. In addition, both of the non-linear distortion and the memory effect distortion included in the first distortion can be dealt with. Therefore, highly accurate distortion compensation can be realized.

(10) A distortion compensation method according to the present embodiment is to be executed by a predistorter connected to an external predistorter configured to compensate for a first distortion occurring in an output of an amplifier. The distortion compensation method includes the steps of: compensating for, out of distortions occurring in the output of the amplifier, a second distortion different from the first distortion; and executing, at a predetermined frequency, an update process of updating a second distortion compensation characteristic for compensating for the second distortion. The first distortion includes a non-linear distortion and a memory effect distortion, the second distortion is a distortion whose temporal change is quicker than the first distortion, and the predetermined frequency is a frequency higher than an update frequency of a first distortion compensation characteristic for compensating for the first distortion. Accordingly, a temporal change in the second distortion can be dealt with. In addition, both of the non-linear distortion and the memory effect distortion included in the first distortion can be dealt with. Therefore, highly accurate distortion compensation can be realized.

(11) A computer program according to the present embodiment is for setting a first distortion compensation circuit having a first distortion compensation characteristic for compensating for a first distortion occurring in an output of an amplifier, the first distortion compensation circuit being configured to compensate for the first distortion, and a second distortion compensation circuit having a second distortion compensation characteristic for compensating for a second distortion occurring in the output of the amplifier, the second distortion compensation circuit being configured to compensate for the second distortion. The computer program causes a computer to execute at a predetermined frequency the steps of: calculating a parameter for setting the second distortion compensation characteristic; and setting the calculated parameter to the second distortion compensation circuit. The first distortion includes a non-linear distortion and a memory effect distortion, the second distortion is a distortion whose temporal change is quicker than the first distortion, and the predetermined frequency is a frequency higher than an update frequency of the first distortion compensation characteristic. Accordingly, a temporal change in the second distortion can be dealt with. In addition, both of the non-linear distortion and the memory effect distortion included in the first distortion can be dealt with. Therefore, highly accurate distortion compensation can be realized.

(12) A computer program according to the present embodiment is for setting a second distortion compensation circuit connected to a first distortion compensation circuit configured to compensate for a first distortion occurring in an output of an amplifier. The computer program causes a computer to execute at a predetermined frequency the steps of: calculating a parameter for setting a distortion compensation characteristic of the second distortion compensation circuit; and setting the calculated parameter to the second distortion compensation circuit. The first distortion includes a non-linear distortion and a memory effect distortion, the second distortion compensation circuit is a circuit configured to compensate for a second distortion, the second distortion is a distortion whose temporal change is quicker than the first distortion, and the predetermined frequency is a frequency higher than an update frequency of a distortion compensation characteristic of the first distortion compensation circuit. Accordingly, a temporal change in the second distortion can be dealt with. In addition, both of the non-linear distortion and the memory effect distortion included in the first distortion can be dealt with. Therefore, highly accurate distortion compensation can be realized.

Details of Embodiment of the Present Disclosure

Hereinafter, embodiments of the present invention will be described with reference to the drawings. At least some parts of the embodiments described below can be combined together as desired.

1. Configuration of Distortion Compensation Device

FIG. 1 shows a wireless communicator 100 including a distortion compensation device 20. The wireless communicator 100 is a base station or a mobile station for mobile communication, for example. The distortion compensation device 20 subjects a baseband signal x[n] outputted from a baseband processing unit (not shown) to perform predistortion compensation, and outputs a distortion compensation signal y[n]'. The distortion compensation signal y[n]' is converted to an analog signal by a digital-analog converter (DAC) 30 and converted to a radio frequency signal by an up-converter 40. The signal outputted from the up-converter 40 is amplified by a power amplifier (PA) 50. The signal outputted from the amplifier 50 is transmitted through an antenna 60.

The power amplifier 50 is a compound semiconductor amplifier (hereinafter, referred to as "GaN amplifier") formed from gallium nitride, for example. In the GaN amplifier, an Idq drift causes an instantaneous change in distortion in the amplifier 50. The power amplifier 50 is not limited to the GaN amplifier and may be any amplifier in which an Idq drift or a high speed drift occurs. The Idq drift could occur in a high electron mobility transistor (HEMT) device formed from a compound semiconductor using, not only GaN, but also AlN (aluminium nitride), InN (indium nitride), and AlGaN, InAlN, and InGaN which are based on these crystal systems. Also, a high speed drift occurs in a compound semiconductor amplifier formed from GaAs, InAs, InP, etc. That is, the above mentioned drift is observed in an amplifier that is an HEMT device formed from a compound semiconductor of III-V groups or the crystal system thereof.

The communicator 100 includes a coupler 36 for monitoring an output of the amplifier 50. The coupler 36 outputs a monitoring signal z[n]. The monitoring signal z[n] is down-converted by a down-converter 70 and converted to a digital signal by an analog-digital converter (ADC) 80. It is assumed that the ADC 80 has a sampling frequency $f_s$. The monitoring signal z[n] is sampled at the sampling frequency $f_s$ to be discrete sample data.

The sample data z[n] is provided to the distortion compensation device 20. The distortion compensation device 20 updates distortion compensation characteristics on the basis of the sample data z[n].

The distortion compensation device 20 shown in FIG. 1 includes a plurality of predistorters A and B. The plurality of predistorters each execute predistortion. In FIG. 1, the predistorter A and the predistorter B are cascade-connected to each other. While the distortion compensation device 20 includes two predistorters A and B in FIG. 1, the distortion compensation device 20 may include three or more predistorters.

The predistorter A serves to perform compensation for a distortion, of distortions in the amplifier 50, which does not temporally change or whose temporal change is gentle. A distortion whose temporal change is gentle is, for example, a changed portion of a distortion due to temperature change.

Regarding distortion compensation, the predistorter B complements the predistorter A. That is, the predistorter B serves to compensate for a distortion component that cannot be compensated for by the predistorter A. The predistorter B according to the embodiment compensates for a distortion whose temporal change is quicker than that of a distortion to be compensated for by the predistorter A. A distortion whose temporal change is quick is, for example, a distortion that instantaneously changes due to an Idq drift.

In order to compensate for a distortion that does not temporally change or whose temporal change is gentle, the predistorter A does not update the distortion compensation characteristic or updates the distortion compensation characteristic at a low frequency. On the other hand, in order to deal with a distortion whose temporal change is quick, the predistorter B updates the distortion compensation characteristic at a high frequency. Hereinafter, the distortion to be compensated for by the predistorter A is also referred to as a "first non-linear distortion", and the distortion to be compensated for by the predistorter B is also referred to as a "second non-linear distortion".

Figure 2:
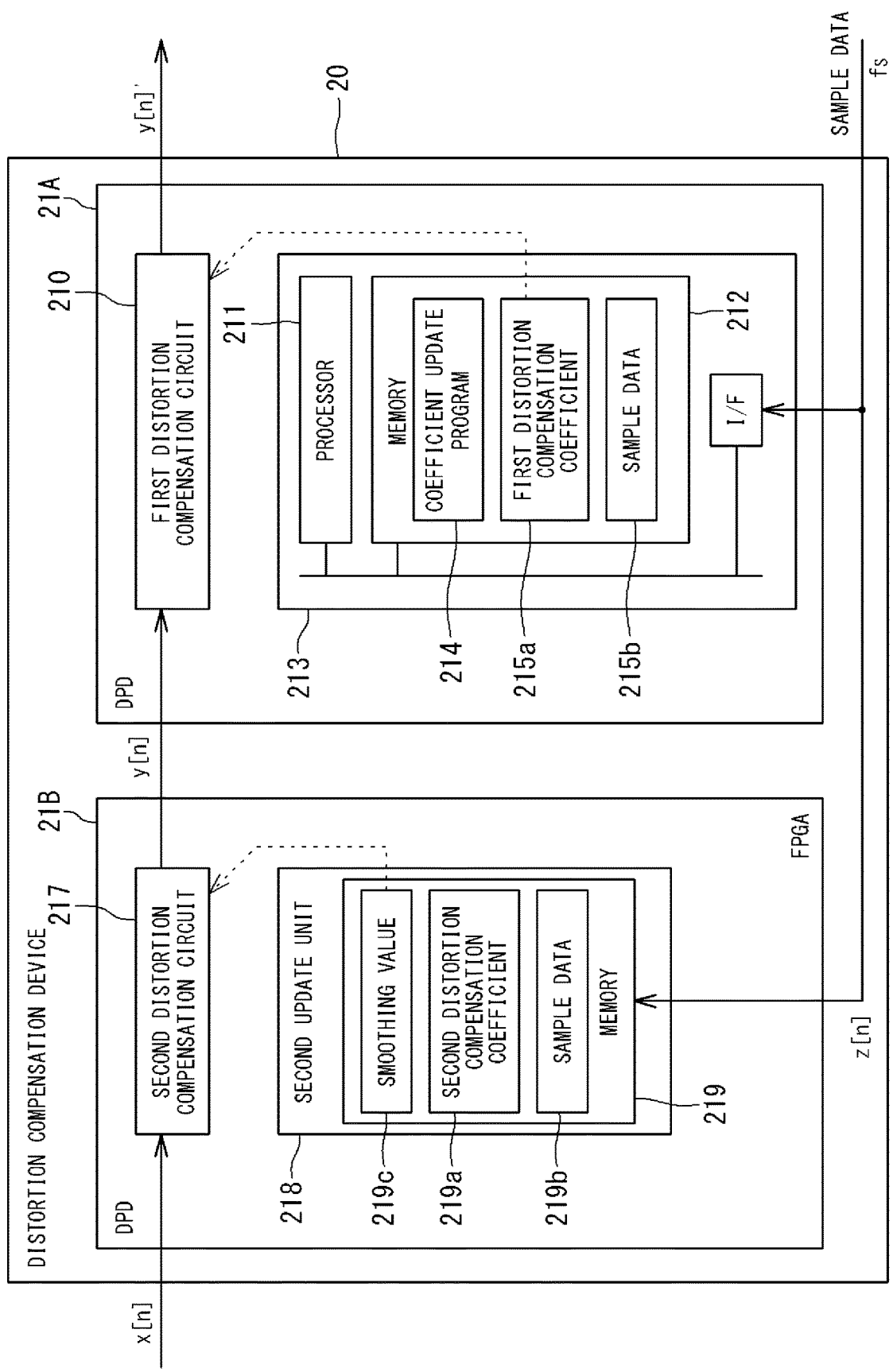
FIG. 2 is a configuration diagram of the distortion compensation device according to the embodiment.

FIG. 2 shows an example of the predistorter A and an example of the predistorter B. In FIG. 2, a predistorter 21A is an example of the predistorter A shown in FIG. 1. In FIG. 2, a predistorter 21B is an example of the predistorter B shown in FIG. 1.

The predistorter 21A is configured to execute digital predistortion (DPD). The predistorter 21A includes a first distortion compensation circuit 210. The first distortion compensation circuit 210 performs predistortion on a baseband signal (a signal y[n] outputted from the predistorter 21B). The first distortion compensation circuit 210 is implemented as a wired logic circuit such as a field-programmable gate array (FPGA), for example. Distortion compensation is performed based on a first distortion compensation coefficient 215a. The first distortion compensation coefficient 215a is a parameter that determines the distortion compensation characteristic of the predistorter 21A. The wired logic circuit may be a reconfigurable logic circuit such as an FPGA, or may be a non-reconfigurable logic circuit.

The distortion compensation characteristic (hereinafter, referred to as a "first distortion compensation characteristic") of the first distortion compensation circuit 210 is specified by a model (hereinafter, referred to as a "first distortion compensation characteristic model") represented by, for example, the following formula (1) (hereinafter, also referred to as a "first characteristic formula").

[Math. 1]

$$y[n]' = \sum_{k1=1}^{K1} \sum_{m1=0}^{M1} h_{k1,m1} |y[n-m1]|^{k1-1} \cdot y[n-m1] \quad (1)$$

where y represents an input signal of the first distortion compensation circuit 210, y' represents an output signal of the first distortion compensation circuit 210, k1 represents an index related to a compensation function for non-linear distortion, m1 represents an index related to a compensation function for memory effect distortion, K1 and M1 represent constants, n represents a discrete time, and $h_{k1, m1}$ represents a coefficient (hereinafter, referred to as a "first distortion compensation coefficient"). That is, the first distortion compensation circuit 210 having the first distortion compensation characteristic has a function of compensating for each of the non-linear distortion and the memory effect distortion. The first distortion compensation characteristic is determined by specifying the first distortion compensation coefficient $h_{k1, m1}$. The first characteristic formula is a first polynomial for compensating for the first non-linear distortion, and the first distortion compensation coefficient $h_{k1, m1}$ corresponds to each term of the first polynomial.

Figure 3:
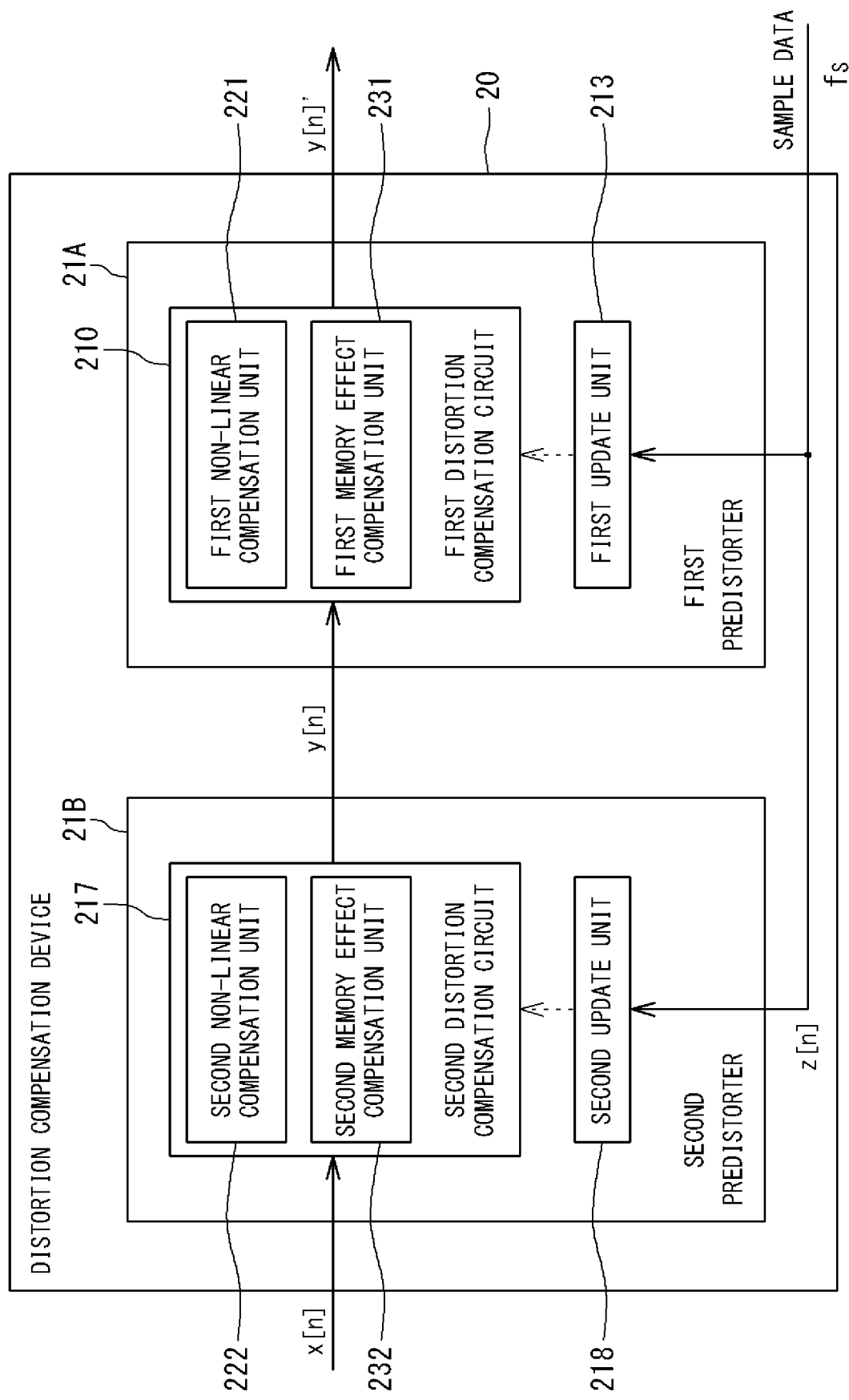
FIG. 3 is a functional block diagram of the distortion compensation device according to the embodiment.

FIG. 3 is a functional block diagram showing functions of the distortion compensation device 20 according to the embodiment. The first distortion compensation circuit 210 has a function as a first non-linear compensation unit 221 and a function as a first memory effect compensation unit 231. The first non-linear compensation unit 221 corresponds to a compensation function for the non-linear distortion, and the first memory effect compensation unit 231 corresponds to a compensation function for the memory effect distortion. The first distortion compensation characteristic is a distortion compensation characteristic that encompasses those of the first non-linear compensation unit 221 and the first memory effect compensation unit 231.

The first distortion compensation characteristic specified by the first characteristic formula above is an example. The first distortion compensation characteristic may be specified by a model different from that of formula (1).

FIG. 2 is referred to again. When K1 is increased, the order of the first characteristic formula is increased. Distortion compensation by the predistorter 21A compensates for relatively-high-order distortions (high order nonlinearities) up to 5-order or 7-order distortion, for example. That is, K1 is set to a relatively great value, such as 5 or greater, for example. Since the distortions up to high-order distortions are compensated for, highly accurate distortion compensation can be realized, but the number of first distortion compensation coefficients 215a is increased.

The predistorter 21A includes a first update unit 213 that updates the first distortion compensation coefficient 215a. In this embodiment, the first update unit 213 is implemented as a computer including a processor 211 and a memory 212. The processor 211 executes a coefficient update program 214, which is a computer program stored in the memory 212. Each function of the first update unit 213 is exhibited by the processor 211 executing the coefficient update program 214, which is a computer program stored in the memory 212 of the computer. The coefficient update program 214 can be stored in a storage medium such as a CD-ROM. The processor 211 executes the coefficient update program 214 to perform a first update process as described later.

The coefficient update program 214 includes a program code that causes the processor 211 to execute the first update process for updating the first distortion compensation coefficient 215a. The first update process is performed based on, for example, sample data 215b indicating the output z[n] of the amplifier 50. The sample data 215b obtained by the predistorter 21A is stored in the memory 212.

In the first update process, for example, the processor 211 solves a normal equation according to a least-squares method, on the basis of several thousand pieces of sample data 215b that have been obtained through sampling within a predetermined time (e.g., several minutes), thereby calculating the first distortion compensation coefficient 215a. The calculated first distortion compensation coefficient 215a is provided to the first distortion compensation circuit 210 to update the distortion compensation coefficient used in the first distortion compensation circuit 210.

A calculation method such as the least-squares method is able to calculate a coefficient with high accuracy, but has a great processing load and takes a long processing time. Moreover, the number of coefficients to be calculated is great, which further increases the processing load. In addition, when using a calculation method such as the least-squares method which needs a large quantity of sample data 215b for coefficient updating, time to obtain the large quantity of sample data 215b is needed.

However, the above-described matters do not pose problems in the predistorter 21A. Since the first update process is executed by the processor 211 at a low frequency such as once every few minutes, a sufficient temporal margin for coefficient updating is ensured, and therefore, taking time for the process does not pose problems. Moreover, since a change in distortion due to a temperature change occurs gently, even the coefficient updating performed at a low frequency can follow the gentle change in distortion. However, the predistorter 21A cannot follow an instantaneous change in distortion caused by an Idq drift or the like. The instantaneous change in distortion is dealt with by the predistorter 21B.

The calculation function of the first distortion compensation coefficient 215a by the least-squares method is an example. For example, the first distortion compensation coefficient 215a may be calculated by another algorithm such as LMS, RMS (Root Mean Squares), or RLS (Recursive Least Squares). Alternatively, the first distortion compensation coefficient 215a may be derived by using a correspondence table between sample data and the first distortion compensation coefficient.

The predistorter 21A may not necessarily have the first update unit 213. That is, the predistorter 21A may have a first distortion compensation characteristic that does not change. In this case, the predistorter 21A need not obtain the sample data 215b. When the predistorter 21A does not have the first update unit 213, a temporal change in distortion is dealt with by the predistorter 21B.

As described above, the predistorter 21B deals with a change in distortion that cannot be dealt with by the predistorter 21A, in particular, an instantaneous change in distortion. The predistorter 21B shown in FIG. 2 is configured to execute digital predistortion (DPD). In FIG. 2, the predistorter 21B is connected to an input side of the predistorter A (connected between the predistorter A and the baseband processing unit). The predistorter 21B is implemented as a wired logic circuit such as a field-programmable gate array (FPGA), for example. The wired logic circuit may be a reconfigurable logic circuit such as an FPGA, or may be a non-reconfigurable logic circuit.

The predistorter 21B includes a circuit that functions as a second distortion compensation circuit 217. The second distortion compensation circuit 217 includes a wired logic circuit for performing predistortion on a baseband signal (here, the signal x[n] outputted from the baseband processing unit). Distortion compensation is performed based on a second distortion compensation coefficient 219a stored in a coefficient storage unit in the predistorter 21B. The second distortion compensation coefficient 219a is a parameter that determines the distortion compensation characteristic of the predistorter 21B.

The distortion compensation characteristic (hereinafter, referred to as a "second distortion compensation characteristic") of the second distortion compensation circuit 217 is specified by a model (hereinafter, referred to as a "second distortion compensation characteristic model") represented by, for example, the following formula (2) (hereinafter, also referred to as a "second characteristic formula").

[Math. 2]

$$y[n] = \sum_{k2=1}^{K2} \sum_{m2=0}^{M2} h_{k2,m2} |x[n-m2]|^{k2-1} \cdot y[n-m2] \quad (2)$$

where x represents an input signal of the second distortion compensation circuit 217, y represents an output signal of the second distortion compensation circuit 217, k2 represents an index related to a compensation function for non-linear distortion, m2 represents an index related to a compensation function for memory effect distortion, K2 and M2 represent constants, n represents a discrete time, and $h_{k2, m2}$ represents a coefficient (hereinafter, referred to as a "second distortion compensation coefficient"). That is, the second distortion compensation circuit 217 having the second distortion compensation characteristic has a function of compensating for each of the non-linear distortion and the memory effect distortion. The second distortion compensation characteristic is determined by specifying the second distortion compensation coefficient $h_{k2, m2}$. The second characteristic formula is a second polynomial for compensating for the second non-linear distortion, and the second distortion compensation coefficient $h_{k2, m2}$ corresponds to each term of the second polynomial.

FIG. 3 is referred to. The second distortion compensation circuit 217 has a function as a second non-linear compensation unit 222 and a function as a second memory effect compensation unit 232. The second non-linear compensation unit 222 corresponds to a compensation function for the non-linear distortion and the second memory effect compensation unit 232 corresponds to a compensation function for the memory effect distortion. The second distortion compensation characteristic is a distortion compensation characteristic that encompasses those of the second non-linear compensation unit 222 and the second memory effect compensation unit 232.

The second distortion compensation characteristic specified by the second characteristic formula above is an example. The second distortion compensation characteristic may be a characteristic that compensates for either one of the non-linear distortion or the memory effect distortion, or may be a characteristic that compensates for a distortion different from the non-linear distortion and the memory effect distortion. In this case, the second distortion compensation characteristic is specified by a model different from that of formula (2).

FIG. 2 is referred to again. Distortion compensation by the predistorter 21B compensates for a relatively low-order distortion (low-order nonlinearity) such as a 3-order distortion, for example. That is, K2 is a constant smaller than K1, and is set to a relatively low value such as 3 or smaller, for example. Since the low-order distortion is compensated for, fewer second distortion compensation coefficients 219a are needed. Consequently, the processing load in the predistorter 21B is small. Therefore, an increase in the circuit scale of the predistorter 21B is inhibited.

When the non-linear order of a distortion compensation characteristic model increases, the frequency bandwidth of the output signal of the distortion compensation circuit increases. The first distortion compensation circuit 210 and the second distortion compensation circuit 217 are configured by a plurality of non-linear Volterra operators. When a signal passes through the non-linear Volterra operators, the signal bandwidth increases in proportion to the order of nonlinearity. For example, a 3-order non-linear Volterra operator expands the signal bandwidth three-fold. Thus, the final bandwidth of the output signal is dependent on the highest order nonlinear Volterra operator. Therefore, since the first distortion compensation circuit 210 has the first distortion compensation characteristic, which is specified by the first characteristic formula of a relatively high order, the frequency bandwidth of the output signal is relatively great. In contrast, since the second distortion compensation circuit 217 has the second distortion compensation characteristic, which is specified by the second characteristic formula of a relatively low order, the frequency bandwidth of the output signal is relatively narrow.

When viewed from the predistorter 21B, only a distortion component, of the distortion in the amplifier 50, which has not been compensated for by the predistorter 21A is present, and thus, the nonlinearity of the distortion to be compensated for by the predistorter 21B is not particularly strong. Therefore, even when the predistorter 21B can compensate for only low-order distortions, it does not cause serious problems.

The predistorter 21B includes a circuit that functions as a second update unit 218 for updating the second distortion compensation coefficient 219a. The second update unit 218 includes a wired logic circuit for executing a second update process for updating the second distortion compensation coefficient 219a. The second update process is performed based on, for example, sample data 219b indicating the output z[n] of the amplifier 50. The sample data 219b obtained by the predistorter 21B is stored in a sample data storage unit in the second update unit 218.

The second update unit 218 performs calculation for updating the second distortion compensation coefficient 219a at a higher frequency than that of the predistorter A. The second update unit 218, for example, updates the second distortion compensation coefficient 219a for each sampling period $1/f_s$ [s] of the sample data 219b, or updates the second distortion compensation coefficient 219a for each period that is several times the length of the sampling period $1/f_s$ [s]. In the following, an example in which the second distortion compensation coefficient 219a is updated for each sampling period $1/f_s$ [s] is described. The second update unit 218, for example, calculates the second distortion compensation coefficient 219a by least mean square (LMS) on the basis of one or a plurality of sample data 219b. The calculated second distortion compensation coefficient 219a is provided to the second distortion compensation circuit 217 to update the distortion compensation coefficient used in the second distortion compensation circuit 217.

The number of sample data 219b used by the second update unit 218 for one-time coefficient updating is small. Therefore, some flip-flops provided in the second update unit 218 are enough as a coefficient storage unit for storing the sample data 219b therein. The coefficient storage unit need not be a large-capacity memory.

The second distortion compensation coefficient based on the LMS is calculated on the basis of the following formulae (3) and (4), for example. The distortion compensation using the calculated second distortion compensation coefficient is performed on the basis of formula (2).

[Math. 3]

$$\tilde{h}[n] = h[n-1] - \alpha \cdot K^H(z[n-1]) \cdot (K(z[n-1]) \cdot h[n-1] - y[n-1]) \quad (3)$$

[Math. 4]

$$h[n] = \lambda \cdot h[n-1] + (1-\lambda) \cdot \tilde{h}[n] \quad (4)$$

In the above formulae, n is a discrete time, α is a predetermined coefficient, K is a polynomial vector for distortion compensation, z[n−1] is sample data at discrete time n−1, h[n] and h[n−1] are second distortion compensation coefficient vectors at discrete time n and discrete time n−1, respectively, y[n] and y[n−1] are outputs (distortion-compensated signals) of the predistorter 21B at discrete time n and discrete time n−1, respectively, and λ is a weight (0<λ<1). Coefficient vector h[n] and polynomial vector K (z[n]) at time n are defined by the following formula (5) and formula (6). T represents transpose and H represents conjugate transpose.

[Math. 5]

$$h[n] = (h_{1,0}[n], h_{1,1}[n], \ldots, h_{1,M}[n], h_{2,0}[n], \ldots, h_{2,M}[n], \ldots, h_{K,0}[n], \ldots, h_{K,M}[n])^T \quad (5)$$

[Math. 6]

$$K(z[n])z[n], z[n-1], \ldots, z[n-M], |z[n]| \cdot z[n], \ldots, |z[n-M]| \cdot z[n-M], \ldots, |z[n]|^{K-1} \cdot z[n], \ldots, |z[n-M]|^{K-1} \cdot z[n-M]) \quad (6)$$

Formula (3) calculates an updated value of the second distortion compensation coefficient vector h[n−1] on the basis of the sample data z[n−1] and the output y[n−1] of the predistorter 21B. Formula (4) calculates a time average of the value updated by formula (3). The calculation of formula (2) is performed by using the time average, of the second distortion compensation coefficient, calculated by formula (3). When the predistorter 21B obtains the sample data, if a delay d not less than one sampling period $1/f_s$ [s] occurs, "n−1" in formulae (3) and (4) may be replaced with "n−d".

A calculation method such as the LMS is inferior in calculation accuracy to the least-squares method, but has less processing load than the least-squares method because the calculation is relatively simple. In addition, the number of coefficients to be calculated and the number of sample data 219b necessary for coefficient updating are less than those in the least-squares method.

The coefficient updating by the second update unit 218 is executed at a high frequency, for example, for each sampling period $1/f_s$ [s] or for each period that is several times the length of the sampling period $1/f_s$ [s]. In addition, the second update unit 218 is a wired logic circuit and therefore can perform calculation at a high speed. Consequently, the second update unit 218 can follow an instantaneous change in distortion caused by an Idq drift or the like to quickly update the second distortion compensation coefficient 219a.

Although the second update unit 218 updates the coefficient at a high frequency, since the processing load per update is not so great, the processing load can be reduced and the circuit scale is also reduced as compared to the case where a coefficient update process with a great processing load is performed at a high frequency.

According to the distortion compensation device 20 shown in FIG. 2, the predistorter 21A compensates for a distortion during a normal operation other than when an instantaneous change in distortion occurs due to an Idq drift or the like, and simultaneously, the predistorter 21B follows, in real time, the instantaneous change in distortion due to an Idq drift or the like to perform distortion compensation. Moreover, since the predistorter 21A is provided, an increase in the processing load of the predistorter 21B is inhibited, thereby inhibiting an increase in the hardware scale.

The LMS, which is a calculation algorithm for the second distortion compensation coefficient 219a, may be NLMS (Normalized Least-mean-squares). The calculation function of the second distortion compensation coefficient 219a by the LMS is an example of the second update unit 218 shown in FIG. 3. For example, the second distortion compensation coefficient 219a may be calculated by another algorithm such as least-squares method, RMS, or RLS. Alternatively, the second distortion compensation coefficient 219a may be derived by using a correspondence table between sample data and the second distortion compensation coefficient.

In the example shown in FIG. 2, the predistorter 21B is implemented as a wired logic circuit. However, regarding update of a distortion compensation coefficient, the predistorter 21B may be implemented as a computer having a processor and a memory, like the predistorter 21A. In this case, the coefficient update process in the predistorter 21B is performed by the processor executing a computer program stored in the memory.

2. Operation of Distortion Compensation Device

Figure 4:
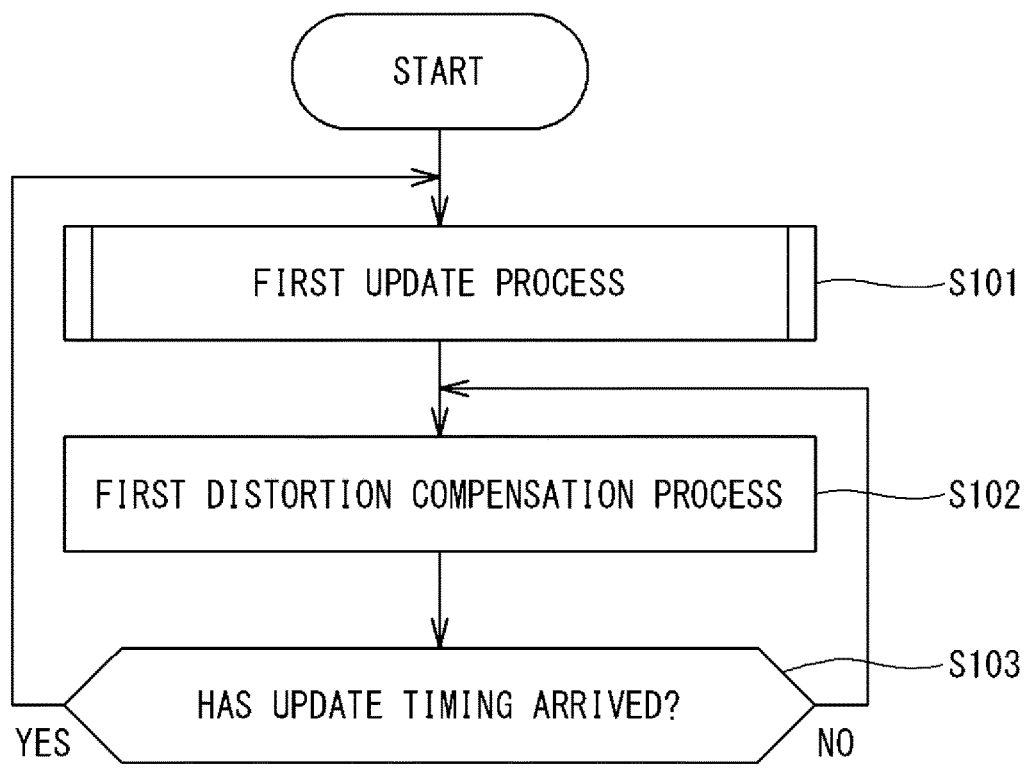
FIG. 4 is a flow chart showing an example of the procedure of operation performed by a first predistorter according to the embodiment.

Next, operation of the distortion compensation device 20 according to the present embodiment is described. FIG. 4 is a flow chart showing an example of the procedure of operation performed by the predistorter 21A.

The processor 211 of the predistorter 21A executes the first update process (step S101). Through the first update process, the first distortion compensation coefficient 215a is determined, and the first distortion compensation characteristic of the first distortion compensation circuit 210 is set.

The first distortion compensation circuit 210 whose first distortion compensation characteristic has been set executes a first distortion compensation process (step S102). The first distortion compensation process is a process in which the first distortion compensation circuit 210 receives an input signal y[n], performs distortion compensation on the input signal y[n] in accordance with the first distortion compensation characteristic to generate an output signal y[n]', and outputs the output signal y[n]'.

The processor 211 determines whether or not an update timing for the first distortion compensation characteristic has arrived (step S103). The first update process is executed at a low frequency. Thus, the interval between updates is set to a relatively long time. For example, the first update process is executed for each period that is several ten to several hundred times the length of the sampling period $1/f_s$ [s].

When the update timing has not arrived (NO in step S103), the process returns to step S102, and the first distortion compensation circuit 210 executes the first distortion compensation process. The first distortion compensation process is executed for each sampling period $f_s$.

When the update timing has arrived (YES in step S103), the process returns to step S101, and the processor 211 executes the first update process again.

Through repeated execution of the above operation, the first distortion compensation characteristic is updated at a low frequency, and the first distortion compensation process is executed for each sampling period $f_s$.

Figure 5:
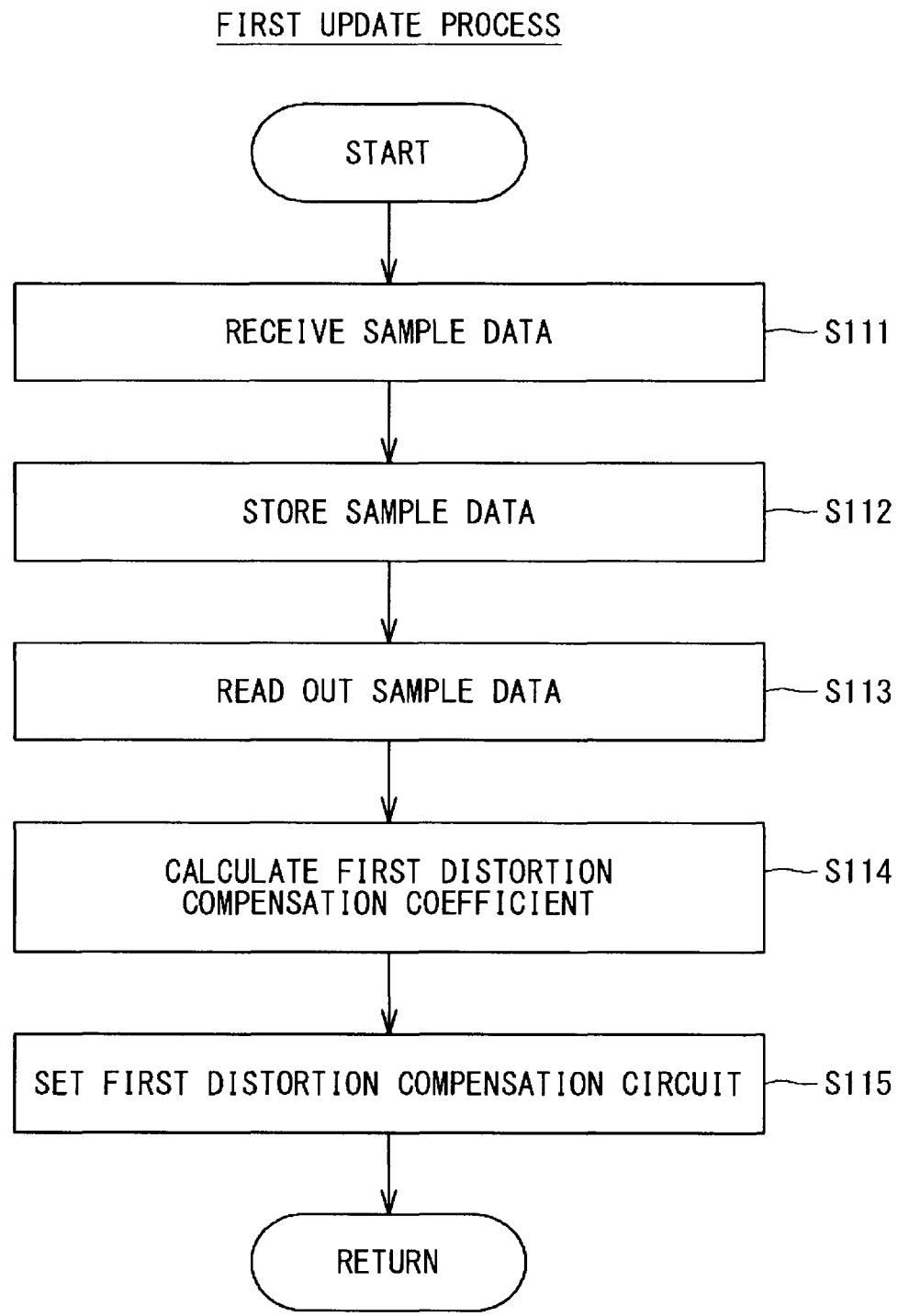
FIG. 5 is a flow chart showing an example of a first update process.

FIG. 5 is a flow chart showing an example of the first update process.

The processor 211 receives sample data 215b (step S111), and stores the sample data 215b in the memory 212 (step S112). Sample data 215b corresponding to a past predetermined period is accumulated in the memory 212. That is, in step S112, newly received sample data is added to and stored in the memory 212 in which the past sample data 215b is stored.

The processor 211 reads out the sample data 215b corresponding to the predetermined period from the memory 212 (step S113). The processor 211 solves a normal equation by the least-squares method using the read out sample data 215b, thereby calculating the first distortion compensation coefficient 215a (step S114).

The processor 211 transmits the first distortion compensation coefficient 215a to the first distortion compensation circuit 210, to set the first distortion compensation circuit 210 (step S115). Accordingly, the first distortion compensation characteristic is updated.

Then, the first update process ends.

Figure 6:
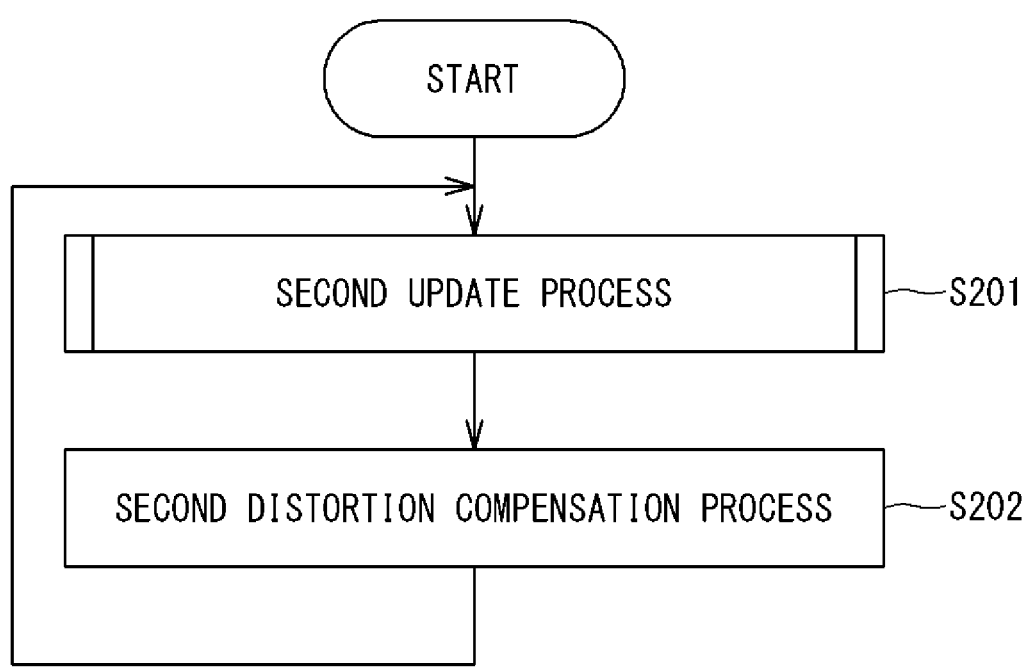
FIG. 6 is a flow chart showing an example of the procedure of operation performed by a second predistorter according to the embodiment.

Next, operation of the predistorter 21B is described. FIG. 6 is a flow chart showing an example of the procedure of operation performed by the predistorter 21B.

The second update unit 218 of the predistorter 21B executes the second update process (step S201). Through the second update process, the second distortion compensation coefficient 219a is determined, and the second distortion compensation characteristic of the second distortion compensation circuit 217 is set.

The second distortion compensation circuit 217 whose second distortion compensation characteristic has been set executes a second distortion compensation process (step S202). The second distortion compensation process is a process in which the second distortion compensation circuit 217 receives an input signal z[n], performs distortion compensation on the input signal z[n] in accordance with the second distortion compensation characteristic to generate an output signal y[n], and outputs the output signal y[n].

When the second distortion compensation process ends, the second update process is executed again (step S201). That is, in this example, the second update process and the second distortion compensation process are repeatedly executed. For example, the second update process and the second distortion compensation process are executed for each sampling period $1/f_s$ [s].

As described above, the second update process is executed at a high frequency. For example, the second update process may be executed for each period that is several times the length of the sampling period $1/f_s$ [s].

Through repeated execution of the above operation, the second distortion compensation characteristic is updated at a high frequency, and the second distortion compensation process is executed for each sampling period $f_s$.

Figure 7:
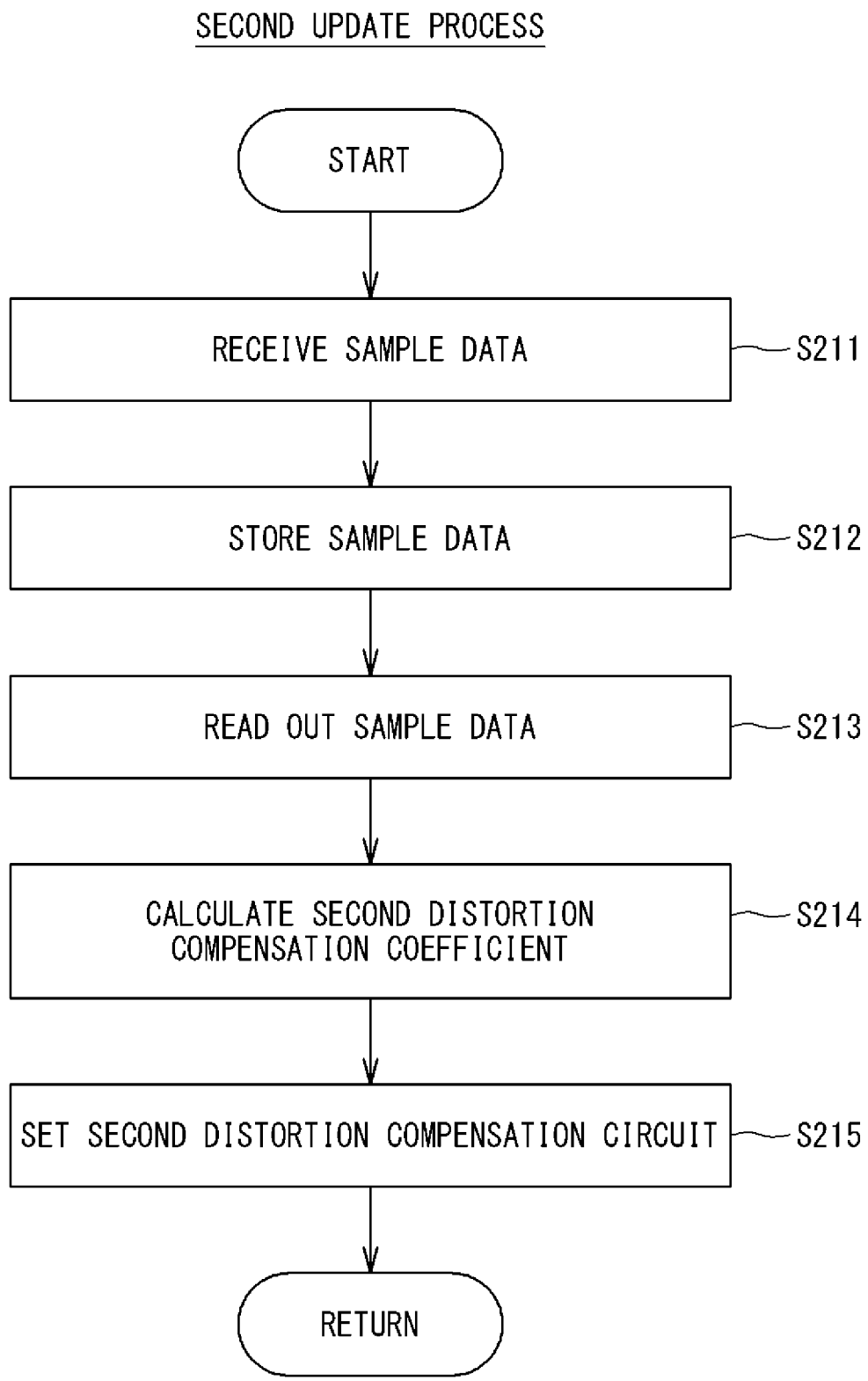
FIG. 7 is a flow chart showing an example of a second update process.

FIG. 7 is a flow chart showing an example of the second update process.

The second update unit 218 receives sample data 219b (step S211), and stores the sample data 219b (step S212). Sample data 219b corresponding to a past predetermined period (a period shorter than the storage period of the sample data 215b) is accumulated in the second update unit 218. That is, in step S212, newly received sample data is added to and stored in the sample data storage unit in which the past sample data 219b is stored.

The second update unit 218 reads out the sample data 219b corresponding to the predetermined period from the sample data storage unit (step S213). The second update unit 218 solves a normal equation by the LMS using the read out sample data 219b, thereby calculating the second distortion compensation coefficient 219a (step S214).

The second update unit 218 transmits the second distortion compensation coefficient 219a to the second distortion compensation circuit 217, to set the second distortion compensation circuit 217 (step S215). Accordingly, the second distortion compensation characteristic is updated.

Then, the second update process ends.

In the distortion compensation device 20 according to the present embodiment, the first distortion compensation circuit 210 deals with a distortion that does not temporally change or whose temporal change due to the state of the amplifier 50 such as temperature, operating time, or power is gentle, and the second distortion compensation circuit 217 deals with a distortion whose temporal change due to a high speed drift such as a Idq drift is quick. That is, the distortion caused by the amplifier 50 includes a first distortion that does not temporally change or whose temporal change is gentle, and a second distortion that changes quicker than the first distortion. The second update unit 218 updates the second distortion compensation characteristic at a higher frequency than the first update unit 213. Accordingly, the temporal change in the second distortion can be dealt with. In addition, the first distortion compensation circuit 210 compensates for both of the non-linear distortion and the memory effect distortion. Therefore, both of the non-linear distortion and the memory effect distortion included in the first distortion can be dealt with. Thus, highly accurate distortion compensation can be realized.

The second distortion compensation circuit 217 may compensate for both of the non-linear distortion and the memory effect distortion. Accordingly, distortion compensation with still higher accuracy can be realized.

The second distortion compensation characteristic of the second distortion compensation circuit 217 may be specified by the second characteristic formula having a lower order than that of the first characteristic formula. Accordingly, even when update of the second distortion compensation characteristic is performed at a high frequency, the processing load can be suppressed.

The frequency bandwidth of the output signal of the second distortion compensation circuit 217 may be narrower than the frequency bandwidth of the output signal of the first distortion compensation circuit 210. In accordance with increase in the frequency bandwidth of the output signal, the processing load is increased. Therefore, when a second frequency bandwidth is set to be narrow, the processing load can be suppressed even when update of the second distortion compensation characteristic is performed at a high frequency.

3. Other Examples of Distortion Compensation Device

Figure 8:
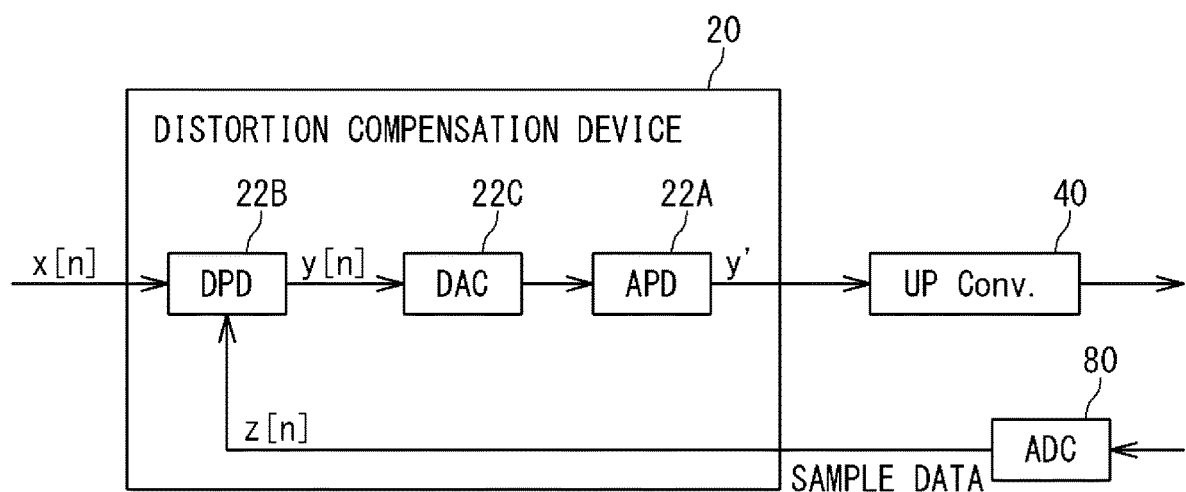
FIG. 8 is a configuration diagram of a distortion compensation device according to a modification of the embodiment.

FIG. 8 shows another example of the distortion compensation device 20. The distortion compensation device 20 shown in FIG. 8 includes a predistorter 22A and a predistorter 22B which are cascade-connected to each other. In FIG. 8, the predistorter 22A is an example of the predistorter A shown in FIG. 1. In FIG. 8, the predistorter 22B is an example of the predistorter B shown in FIG. 1.

The predistorter 22A shown in FIG. 8 performs analog predistortion (APD). The predistorter 22A is implemented as an analog circuit having inverse characteristics of amplification characteristics of the amplifier 50. The predistorter 22A shown in FIG. 8 is functionally equivalent to the predistorter 21A shown in FIG. 2 from which a coefficient update function is eliminated. The predistorter 22A shown in FIG. 8 does not have an updating function of the distortion compensation characteristic, and therefore cannot deal with a temporal change in distortion. The predistorter 22B deals with a temporal change in distortion including an instantaneous change in distortion.

The predistorter 22B is configured to execute digital predistortion (DPD). The configuration and function of the predistorter 22B are the same as those of the predistorter 21B shown in FIG. 2. A coefficient update module in the predistorter 22B may be implemented as a computer having a memory and a processor.

According to the distortion compensation device 20 shown in FIG. 8, the predistorter 22A compensates for a distortion component, of the distortion in the amplifier 50, excluding a portion corresponding to a temporal change, and simultaneously, the predistorter 22B follows, in real time, the temporal change in distortion to perform distortion compensation. Moreover, since the predistorter 22A is provided, an increase in the processing load of the predistorter 22B is inhibited, thereby inhibiting an increase in the hardware scale.

In FIG. 8, a DAC 22C is provided between the predistorter 22B and the predistorter 22A. A digital distortion compensation signal outputted from the predistorter 22B is converted to an analog signal by the DAC 22C. An analog distortion compensation signal is provided to the predistorter 22A. Since an output of the predistorter 22A is an analog signal, the DAC 30 provided between the distortion compensation device 20 and the up-converter 40 in FIG. 1 is not necessary in FIG. 8.

Figure 9:
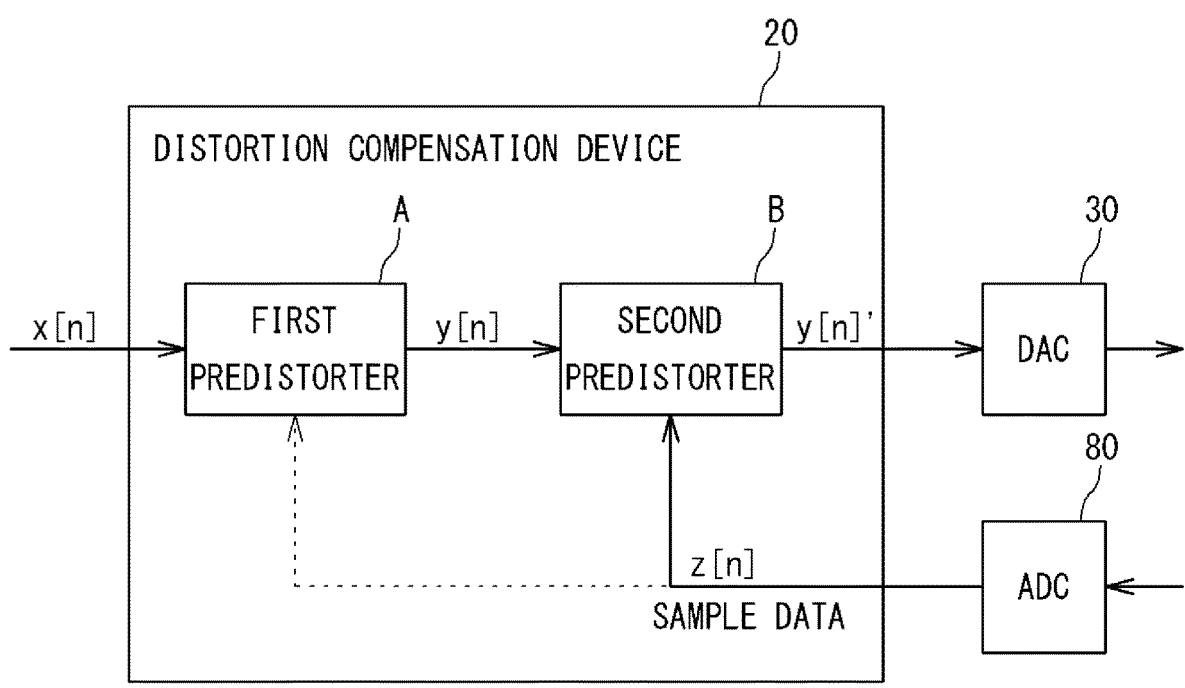
FIG. 9 is a configuration diagram of a distortion compensation device according to a modification of the embodiment.

FIG. 9 shows still another example of the distortion compensation device 20.

The distortion compensation device 20 shown in FIG. 9 includes a predistorter A and a predistorter B which are cascade-connected to each other. In FIG. 9, the arrangement of the predistorter A and the predistorter B is inverted from that shown in FIG. 1, and the predistorter B is connected to the output side of the predistorter A.

Also in the distortion compensation device 20 shown in FIG. 9, the predistorter A compensates for a distortion during a normal operation other than when an instantaneous change in distortion occurs due to an Idq drift or the like, and simultaneously, the predistorter B follows, in real time, the instantaneous change in distortion due to an Idq drift or the like to perform distortion compensation. Moreover, since the predistorter A is provided, an increase in the processing load of the predistorter B is inhibited, thereby inhibiting an increase in the hardware scale.

Figure 10:
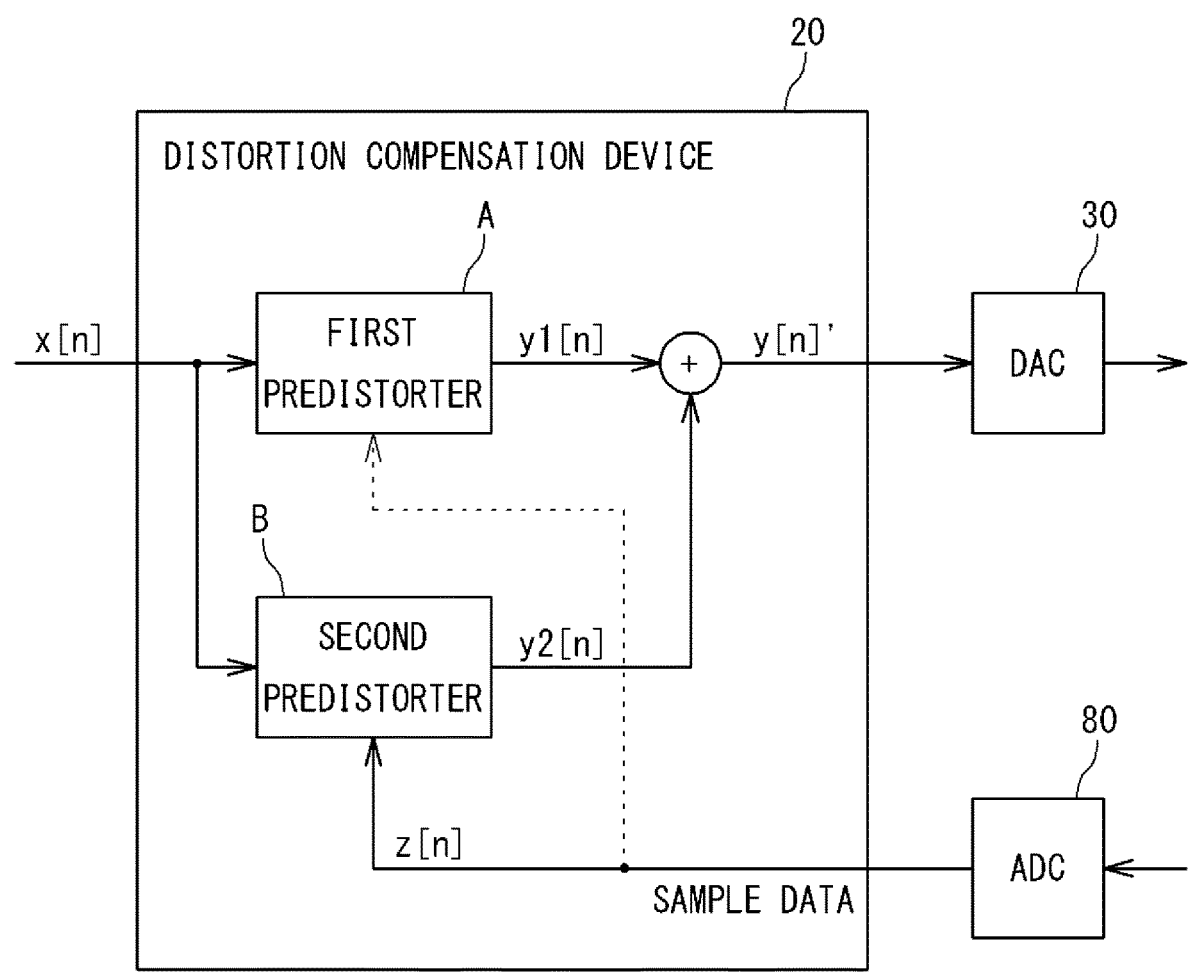
FIG. 10 is a configuration diagram of a distortion compensation device according to a modification of the embodiment.

FIG. 10 shows still another example of the distortion compensation device 20. The distortion compensation device 20 shown in FIG. 10 includes a predistorter A and a predistorter B which are connected in parallel. In FIG. 10, a baseband signal x[n] is provided to the predistorter A and the predistorter B. The predistorter A compensates for a distortion during a normal operation other than when an instantaneous change in distortion occurs due to an Idq drift or the like. The predistorter A outputs a first distortion compensation signal y1[n]. The predistorter B deals with an instantaneous change in distortion due to an Idq drift or the like, and outputs a second distortion compensation signal y2[n]. The first distortion compensation signal y1[n] and the second distortion compensation signal y2[n] are added by an adder. The distortion compensation device 20 outputs a distortion compensation signal y[n] obtained through the addition.

Also in the distortion compensation device 20 shown in FIG. 10, the predistorter A compensates for a distortion during a normal operation other than when an instantaneous change in distortion occurs due to an Idq drift or the like, and simultaneously, the predistorter B follows, in real time, an instantaneous change in distortion due to an Idq drift or the like to perform distortion compensation. Moreover, since the predistorter A is provided, an increase in the processing load of the predistorter B is inhibited, thereby inhibiting an increase in the hardware scale.

Figure 11:
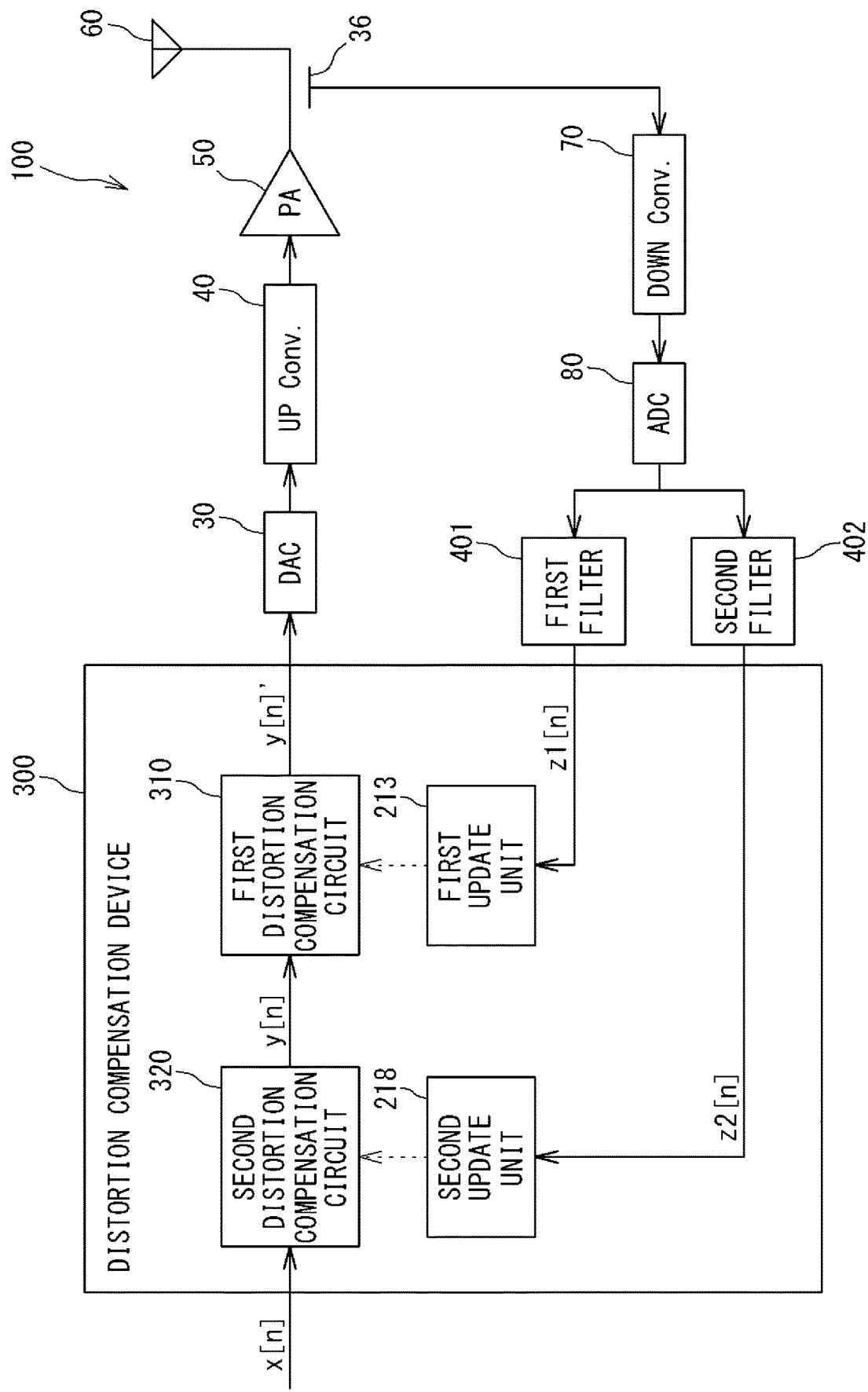
FIG. 11 is a configuration diagram of a wireless communicator according to a modification of the embodiment.

FIG. 11 shows another example of the wireless communicator. The wireless communicator 100 shown in FIG. 11 includes a first filter 401 and a second filter 402 which convert a monitoring signal z[n].

The signal line on the output side of the ADC 80 is branched. The first filter 401, which is a digital filter, is connected to one of the branches and the second filter 402, which is a digital filter, is connected to the other of the branches.

Each of the first filter 401 and the second filter 402 may be a filter that allows a signal in a specific frequency band to pass therethrough, and may be one type of, for example, a low-pass filter, a bandpass filter, and a high-pass filter. The type (pass band) of the filter may be determined on the basis of the band to which the down-converter 70 performs down-conversion. For example, when the wireless communicator 100 is of a zero-IF type, i.e., a direct conversion receiver, the first filter 401 and the second filter 402 can each be implemented as a low-pass filter. In a case of a zero-IF wireless communicator, the center frequency of the output signal of the ADC 80 is direct current (frequency=0), and when the first filter 401 and the second filter 402 are each implemented as a low-pass filter, a signal in the signal band and the bands adjacent thereto is allowed to pass therethrough.

The output side of the first filter 401 is connected to a first update unit 213. A first monitoring signal z1[n], which is an output signal from the first filter 401, is inputted to the first update unit 213. The first update unit 213 obtains sample data from the inputted first monitoring signal z1[n], and on the basis of the sample data, updates the first distortion compensation coefficient to be provided to a first distortion compensation circuit 310 through the first update process.

The output side of the second filter 402 is connected to a second update unit 218. A second monitoring signal z2[n], which is an output signal from the second filter 402, is inputted to the second update unit 218. The second update unit 218 obtains sample data from the inputted second monitoring signal z2[n], and on the basis of the sample data, updates the second distortion compensation coefficient to be provided to a second distortion compensation circuit 320 through the second update process.

The pass band of the second filter 402 is narrower than the pass band of the first filter 401. That is, the frequency bandwidth of the second monitoring signal z2[n], which is the output signal from the second filter 402, is narrower than that of the first monitoring signal z1[n], which is the output signal from the first filter 401. Since the second distortion compensation circuit 320 compensates for a relatively low-order distortion (low-order nonlinearity), outer bands, in the entire frequency band of the monitoring signal z[n], that correspond to high-order distortions are not necessary. In addition, signal components in the outer bands could cause instability of the second distortion compensation coefficient. In the present modification, since the pass band of the second filter 402 is narrower than that of the first filter 401, a second monitoring signal z2[n] from which signal components in the outer bands are eliminated can be obtained, and instability of the second distortion compensation coefficient can be inhibited.

When compared with the second distortion compensation circuit 320, the first distortion compensation circuit 310 compensates for distortions up to high-order distortions (high order nonlinearities), and thus, needs the outer bands that correspond to high-order distortions. Rather, lack of signal components in the outer bands could cause instability of the first distortion compensation coefficient. In the present modification, since the pass band of the first filter 401 is wider than that of the second filter 402, a first monitoring signal z1[n] that contains signal components in the outer bands can be obtained, thereby inhibiting instability of the first distortion compensation coefficient.

The first filter 401 may not necessarily be a filter that allows passage through a specific band, such as a low-pass filter, a bandpass filter, or a high-pass filter. For example, the first filter 401 may be a filter that allows passage through the entire bandwidth, such as an all-pass filter.

Figure 12:
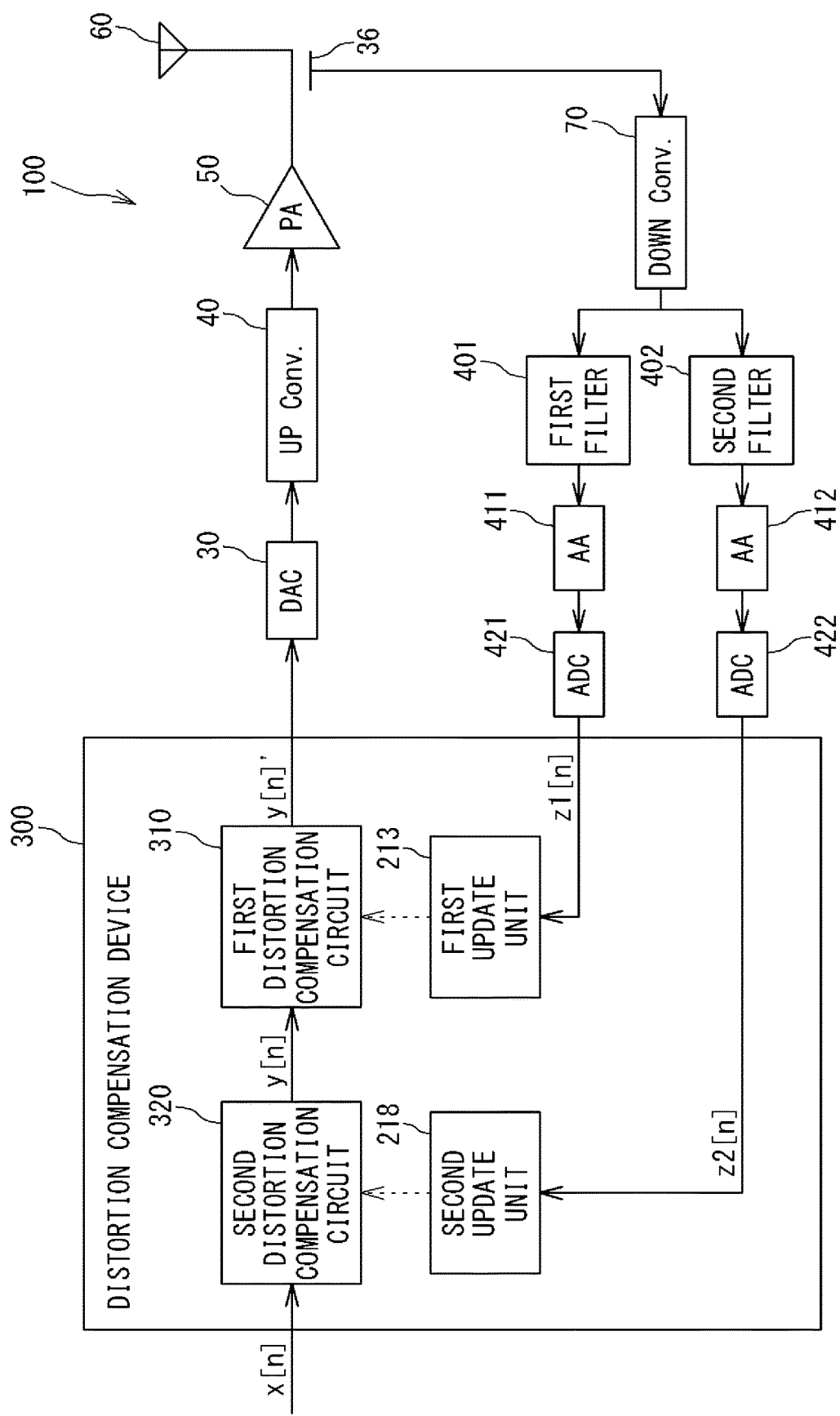
FIG. 12 is a configuration diagram of a wireless communicator according to a modification of the embodiment.

Each of the first filter 401 and the second filter 402 may be an analog filter. FIG. 12 shows an example of a wireless communicator in which the first filter 401 and the second filter 402 are each implemented as an analog filter.

The signal line on the output side of the down-converter 70 is branched. The first filter 401, which is an analog filter, is connected to one of the branches, and the second filter 402, which is an analog filter, is connected to the other of the branches. An antialiasing filter 411 and an ADC 421 are connected in series on the output side of the first filter 401. An antialiasing filter 412 and an ADC 422 are connected in series on the output side of the second filter 402.

Each of the first filter 401 and the second filter 402 may be a filter that allows a signal in a specific frequency band to pass therethrough, and may be one type of, for example, a low-pass filter, a bandpass filter, and a high-pass filter. The type (pass band) of the filter may be determined on the basis of the band to which the down-converter 70 performs down-conversion. For example, when the wireless communicator 100 is of a zero-IF type, i.e., a direct conversion receiver, the first filter 401 and the second filter 402 can each be implemented as a low-pass filter. In a case of a zero-IF wireless communicator, the center frequency of the output signal of the ADC 80 is direct current (frequency=0), and when the first filter 401 and the second filter 402 are each implemented as a low-pass filter, a signal in the signal band and the bands adjacent thereto is allowed to pass therethrough.

The output side of the ADC 421 is connected to a first update unit 213. A first monitoring signal z1 [n], which is an output signal from the ADC 421, is inputted to the first update unit 213. The first update unit 213 obtains sample data from the inputted first monitoring signal z1[n], and on the basis of the sample data, updates the first distortion compensation coefficient to be provided to a first distortion compensation circuit 310 through the first update process.

The output side of the ADC 422 is connected to a second update unit 218. A second monitoring signal z2[n], which is an output signal from the ADC 422, is inputted to the second update unit 218. The second update unit 218 obtains sample data from the inputted second monitoring signal z2[n], and on the basis of the sample data, updates the second distortion compensation coefficient to be provided to a second distortion compensation circuit 320 through the second update process.

The pass band of the second filter 402 is narrower than the pass band of the first filter 401. That is, the frequency bandwidth of the second monitoring signal z2[n], which is the output signal from the ADC 422, is narrower than that of the first monitoring signal z1[n], which is the output signal from the ADC 421. In the present modification, since the pass band of the second filter 402 is narrower than that of the first filter 401, a second monitoring signal z2[n] from which signal components in outer bands are eliminated can be obtained, and instability of the second distortion compensation coefficient can be inhibited. In addition, since the pass band of the first filter 401 is wider than that of the second filter 402, a first monitoring signal z1[n] containing signal components in the outer bands can be obtained, and instability of the first distortion compensation coefficient can be inhibited.

Figure 13:
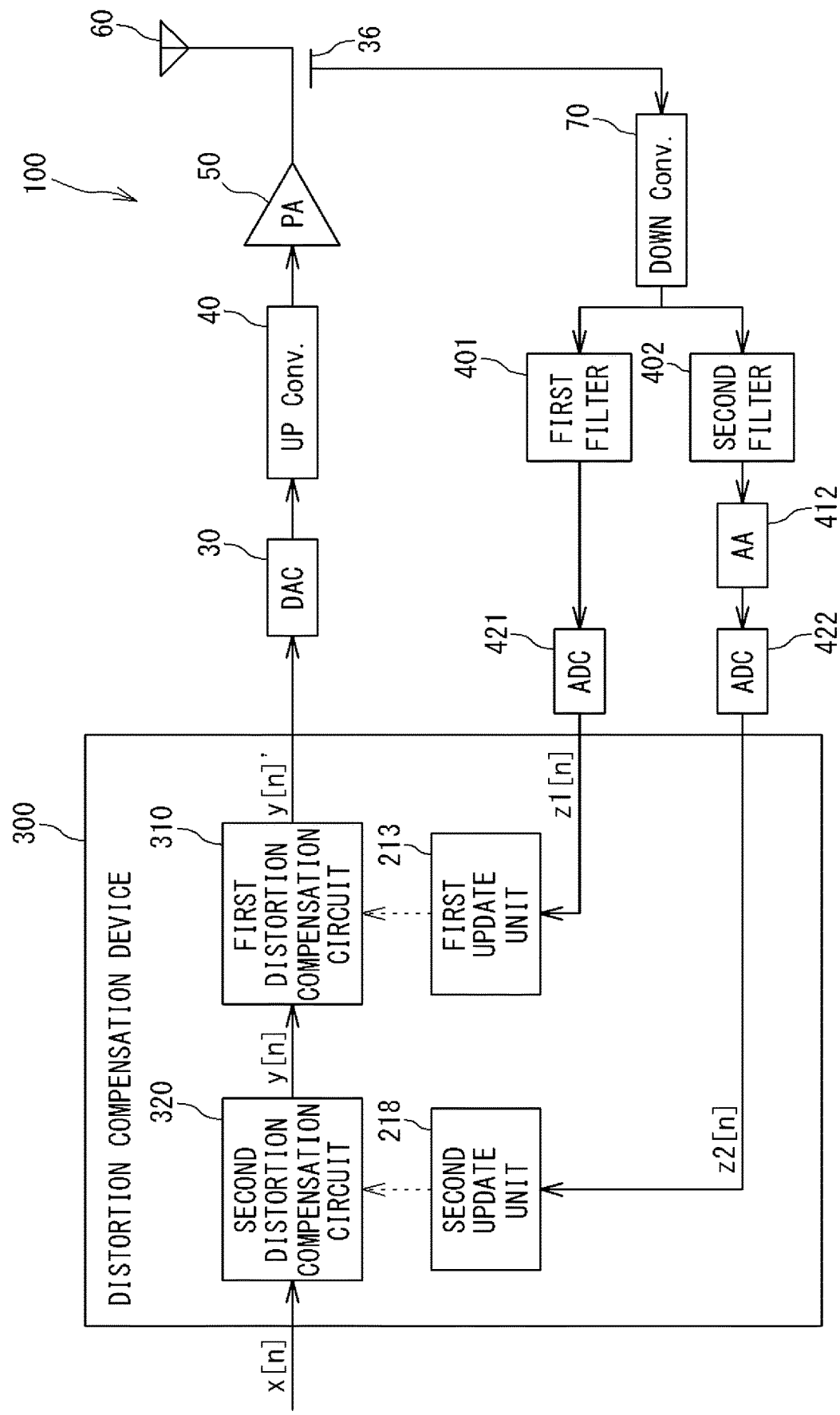
FIG. 13 is a configuration diagram of a wireless communicator according to a modification of the embodiment.

FIG. 13 shows another example of the wireless communicator in which the first filter 401 and the second filter 402 are each implemented as an analog filter.

The signal line on the output side of the down-converter 70 is branched. The first filter 401 is connected to one of the branches, and the second filter 402 is connected to the other of the branches. The first filter 401 is an antialiasing filter. An ADC 421 is connected to the output side of the first filter 401. The second filter 402 is a filter that allows a signal in a specific frequency band to pass therethrough, and may be one type of, for example, a low-pass filter, a bandpass filter, and a high-pass filter. An antialiasing filter 412 and an ADC 422 are connected in series on the output side of the second filter 402.

Figure 14:
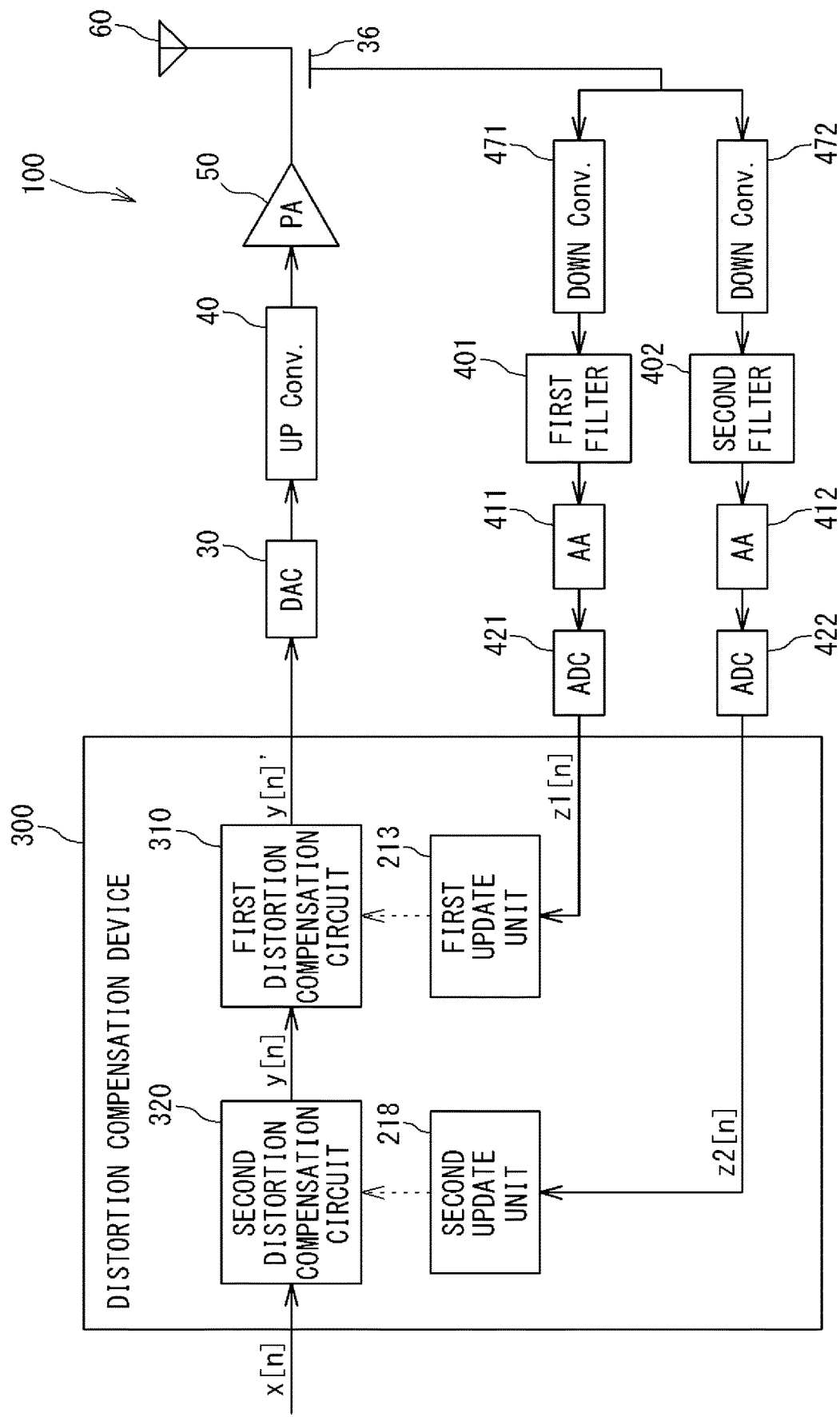
FIG. 14 is a configuration diagram of a wireless communicator according to a modification of the embodiment.

FIG. 14 shows another example of the wireless communicator in which the first filter 401 and the second filter 402 are each implemented as an analog filter.

The signal line on the output side of the coupler 36 is branched, and down-converters 471, 472 are connected to the respective branches. The first filter 401 is connected to the output side of the down-converter 471, and the second filter 402 is connected to the output side of the down-converter 472. An antialiasing filter 411 and an ADC 421 are connected in series on the output side of the first filter 401. An antialiasing filter 412 and an ADC 422 are connected in series on the output side of the second filter 402.

Figure 15:
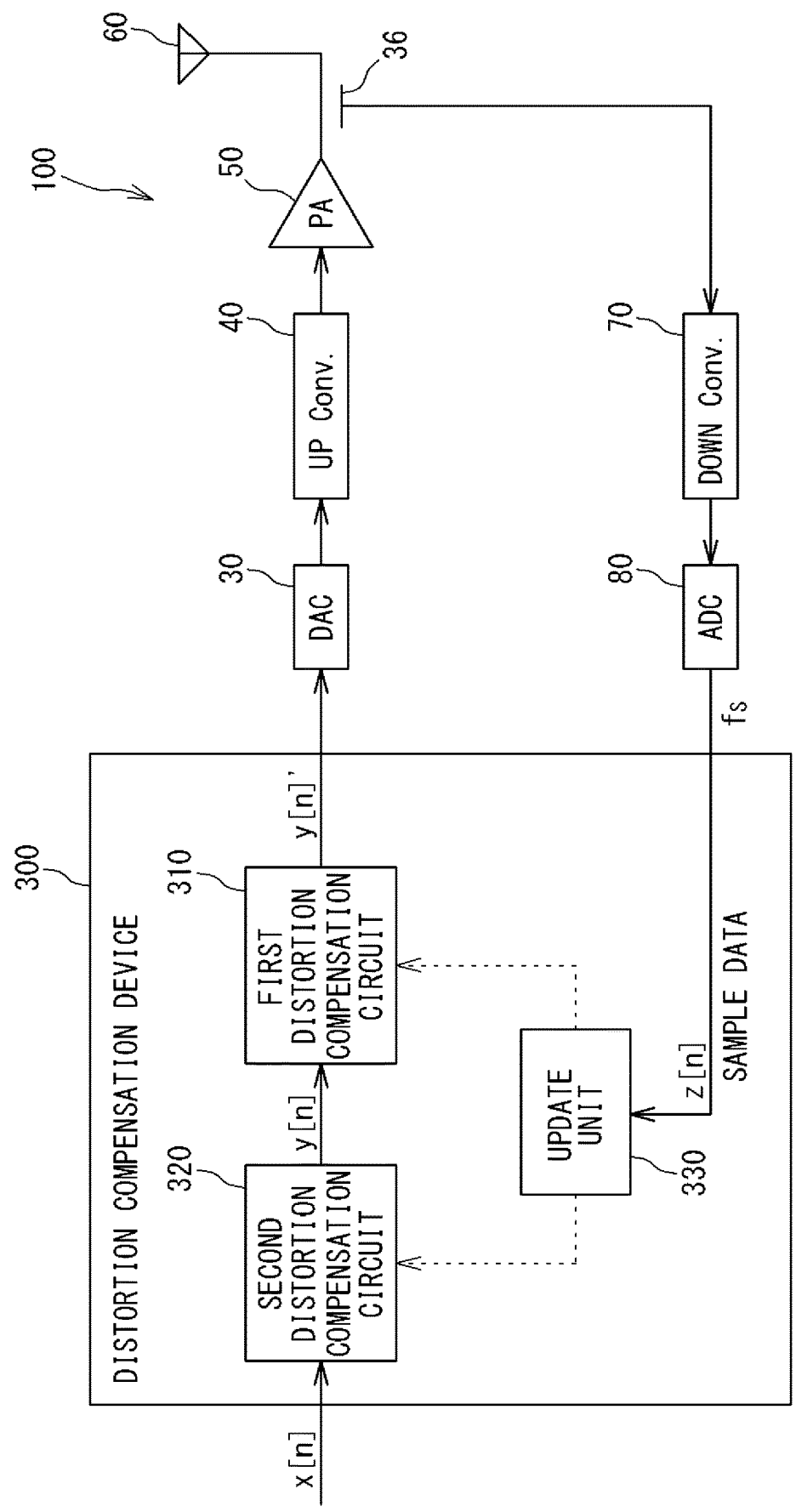
FIG. 15 is a configuration diagram of a wireless communicator including a distortion compensation device according to a modification of the embodiment.

FIG. 15 shows still another example of the distortion compensation device. A distortion compensation device 300 shown in FIG. 15 includes a first distortion compensation circuit 310, a second distortion compensation circuit 320, and an update unit 330. The update unit 330 updates the first distortion compensation characteristic of the first distortion compensation circuit 310 and the second distortion compensation characteristic of the second distortion compensation circuit 320.

The first distortion compensation circuit 310 has the first distortion compensation characteristic represented by the first characteristic formula of formula (1), for example. The second distortion compensation circuit 320 has the second distortion compensation characteristic represented by the second characteristic formula of formula (2), for example.

Figure 16:
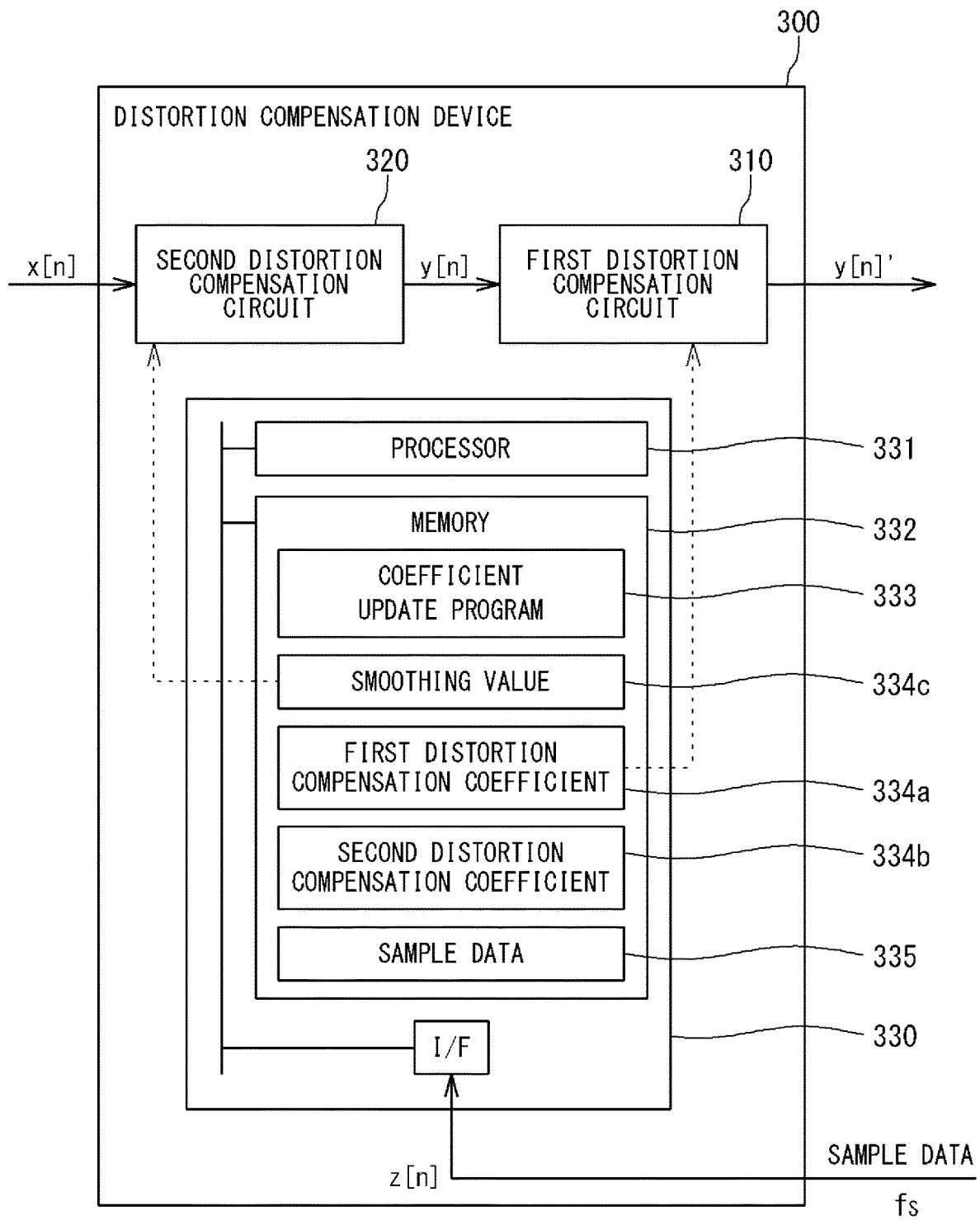
FIG. 16 is a configuration diagram of a distortion compensation device according to a modification of the embodiment.

FIG. 16 is a block diagram showing an example of a configuration of the distortion compensation device 300 in the present modification. The distortion compensation device 300 in this example includes the update unit 330 implemented as a computer having a processor 331 and a memory 332. The processor 331 executes a coefficient update program 333, which is a computer program stored in the memory 332. Each function of the update unit 330 is exhibited by the processor 331 executing the coefficient update program 333, which is a computer program stored in the memory 332 of the computer. The coefficient update program 333 can be stored in a storage medium such as a CD-ROM. The processor 331 executes the coefficient update program 333 to perform a first update process and a second update process as described later.

The coefficient update program 333 includes a program code that causes the processor 331 to execute a first update process for updating the first distortion compensation coefficient 334a and a second update process for updating the second distortion compensation coefficient 334b. The first update process and the second update process are performed based on, for example, sample data 335 indicating the output z[n] of the amplifier 50. The sample data 335 obtained by the distortion compensation device 300 is stored in the memory 332.

In the first update process, for example, the processor 331 solves a normal equation according to a least-squares method, on the basis of several thousand pieces of sample data 335 that have been obtained through sampling within a predetermined time (e.g., several minutes), thereby calculating the first distortion compensation coefficient 334a. The calculated first distortion compensation coefficient 334a is provided to the first distortion compensation circuit 310 to update the distortion compensation coefficient used in the first distortion compensation circuit 310.

In the second update process, for example, the processor 331 solves the LMS according to, for example, formulae (3) and (4) on the basis of a part of the sample data 335, thereby calculating the second distortion compensation coefficient 334b. The calculated second distortion compensation coefficient 334b is provided to the second distortion compensation circuit 320 to update the distortion compensation coefficient used in the second distortion compensation circuit 320.

The number of second distortion compensation coefficients 334b is smaller than the number of first distortion compensation coefficients 334a. Therefore, the processing load for calculating the second distortion compensation coefficients 334b is less than the processing load for calculating the first distortion compensation coefficients 334a. The first update process is executed at a low frequency, and the second update process is executed at a high frequency.

Figure 17:
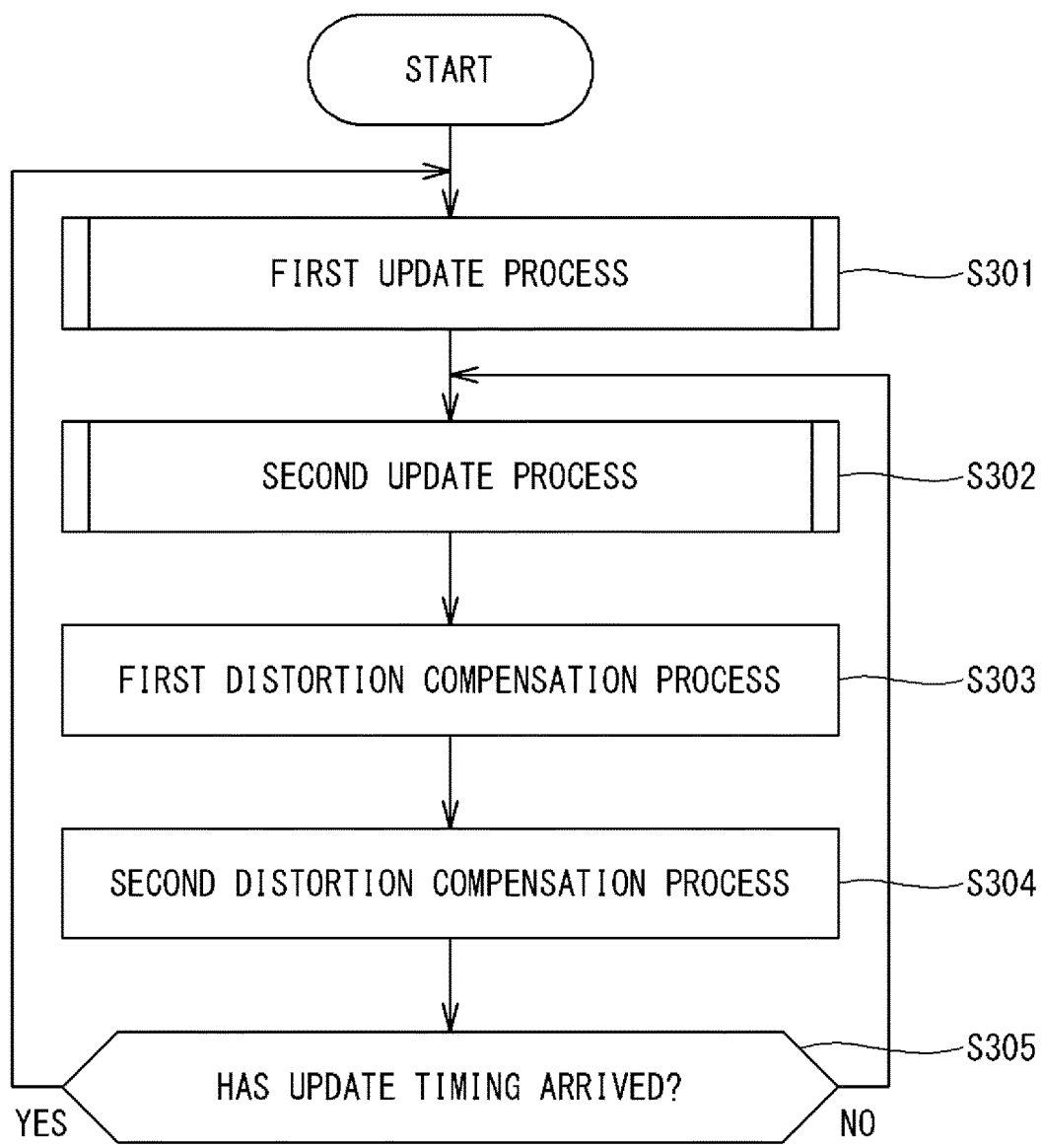
FIG. 17 is a flow chart showing the procedure of operation performed by a distortion compensation device according to a modification of the embodiment.

Next, operation of the distortion compensation device 300 in the present example is described. FIG. 17 is a flow chart showing an example of the procedure of operation performed by the distortion compensation device 300.

The processor 331 executes a first update process (step S301). Through the first update process, the first distortion compensation coefficient 334a is determined, and the first distortion compensation characteristic of the first distortion compensation circuit 310 is set.

The processor 331 executes a second update process (step S302). Through the second update process, the second distortion compensation coefficient 334b is determined, and the second distortion compensation characteristic of the second distortion compensation circuit 320 is set.

The first distortion compensation circuit 310 whose first distortion compensation characteristic has been set executes a first distortion compensation process (step S303). The first distortion compensation process is a process in which the first distortion compensation circuit 310 receives an input signal y[n], performs distortion compensation on the input signal y[n] in accordance with the first distortion compensation characteristic to generate an output signal y[n]', and outputs the output signal y[n]'.

The second distortion compensation circuit 320 whose second distortion compensation characteristic has been set executes a second distortion compensation process (step S304). The second distortion compensation process is a process in which the second distortion compensation circuit 320 receives an input signal z[n], performs distortion compensation on the input signal z[n] in accordance with the second distortion compensation characteristic to generate an output signal y[n], and outputs the output signal y[n].

The processor 331 determines whether or not an update timing for the first distortion compensation characteristic has arrived (step S305). The first update process is executed at a low frequency. Thus, the interval between updates is set to a relatively long time.

When the update timing has not arrived (NO in step S305), the process returns to step S302, the processor 331 executes the second update process (step S302), the first distortion compensation circuit 310 executes the first distortion compensation process (step S303), and the second distortion compensation circuit 320 executes the second distortion compensation process (step S304). The second update process is executed for each sampling period $f_s$, for example. The first distortion compensation process and the second distortion compensation process are executed for each sampling period $f_s$.

When the update timing has arrived (YES in step S305), the process returns to step S301, and the processor 331 executes the first update process. For example, the first update process is executed for each period that is several ten to several hundred times the length of the sampling period $1/f_s$.

The first update process S301 and the second update process S302 may respectively be processes similar to the first update process and the second update process shown in, for example, FIG. 5 and FIG. 7.

Through repeated execution of the above operation, the first distortion compensation characteristic is updated at a low frequency, and the second distortion compensation characteristic is updated at a high frequency. The first distortion compensation process and the second distortion compensation process are executed for each sampling period $f_s$.

Figure 18:
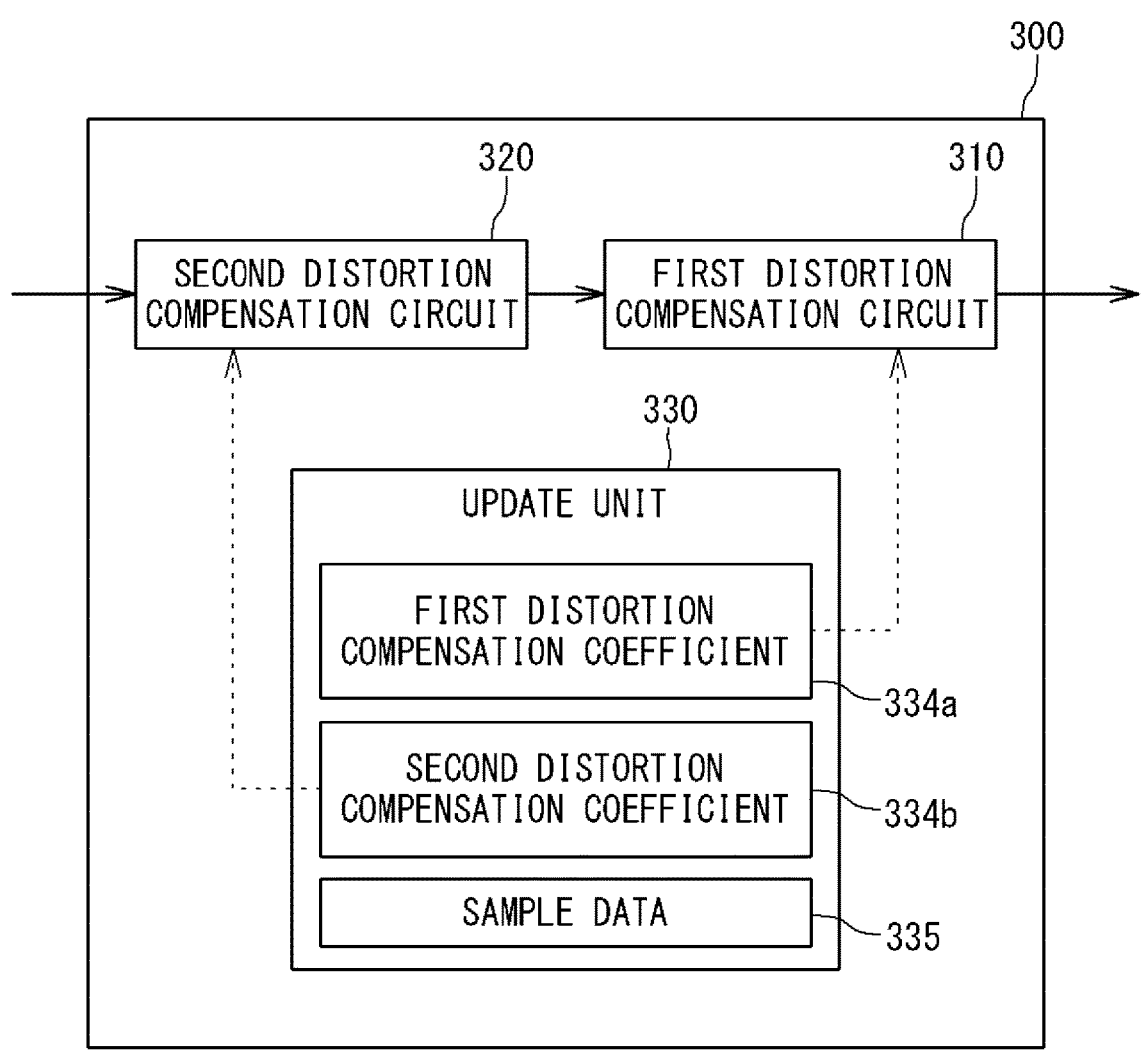
FIG. 18 is a configuration diagram of a distortion compensation device according to a modification of the embodiment.

FIG. 18 is a block diagram showing another example of the configuration of the distortion compensation device 300. In the present example, the update unit 330 is implemented as a wired logic circuit such an FPGA or an ASIC (Application Specific Integrated Circuit), instead of a computer.

The update unit 330 includes a partial circuit that executes a first update process for updating the first distortion compensation coefficient 334a and a partial circuit that executes a second update process for updating the second distortion compensation coefficient 334b. The first update process is performed based on sample data 335 indicating the output z[n] of the amplifier 50, and the second update process is performed based on, for example, a part of the sample data 335. The sample data 335 obtained by the distortion compensation device 300 is stored in a sample data storage unit of the update unit 330.

The number of second distortion compensation coefficients 334b is smaller than the number of first distortion compensation coefficients 334a. Therefore, the processing load for calculating the second distortion compensation coefficients 334b is less than the processing load for calculating the first distortion compensation coefficients 334a. In the update process, the first distortion compensation coefficient 334a is calculated at a low frequency, and the second distortion compensation coefficient 334b is calculated at a high frequency.

4. Supplementary Note

It should be noted that the embodiment disclosed herein is merely illustrative and not restrictive in all aspects. The scope of the present invention is defined by the scope of the claims, and is intended to include meaning equivalent to the scope of the claims and all modifications within the scope.

REFERENCE SIGNS LIST 100 wireless communicator
20, 300 distortion compensation device
30, 22C digital-analog converter
36 coupler
40 up-converter
50 power amplifier
60 antenna
70, 471, 472 down-converter
80 analog-digital converter
21A, 22A, A first predistorter
21B, 22B, B second predistorter
210, 310 first distortion compensation circuit
211, 331 processor
212, 332 memory
213 first update unit
214, 333 coefficient update program
215a, 334a first distortion compensation coefficient
215b, 219b, 335 sample data
217, 320 second distortion compensation circuit
218 second update unit
219a, 334b second distortion compensation coefficient
221 first non-linear compensation unit
222 second non-linear compensation unit
231 first memory effect compensation unit
232 second memory effect compensation unit
330 update unit
401 first filter
402 second filter
411, 412 antialiasing filter

The invention claimed is:
1. A distortion compensation device comprising:
a first distortion compensation circuit having a first distortion compensation characteristic for compensating for a first distortion occurring in an output of an amplifier, the first distortion compensation circuit being configured to compensate for the first distortion;
a second distortion compensation circuit having a second distortion compensation characteristic for compensat- ing for a second distortion occurring in the output of the amplifier, the second distortion compensation circuit being configured to compensate for the second distortion; and an update unit configured to update the second distortion compensation characteristic, wherein the first distortion includes a non-linear distortion and a memory effect distortion, the second distortion is a distortion whose temporal change is quicker than the first distortion, and the update unit updates the second distortion compensation characteristic at a higher frequency than an update frequency of the first distortion compensation characteristic.

2. The distortion compensation device according to claim 1, wherein the second distortion includes at least one of the non-linear distortion and the memory effect distortion.

3. The distortion compensation device according to claim 1, wherein the first distortion compensation characteristic is specified by a first characteristic formula of a predetermined order, and the second distortion compensation characteristic is specified by a second characteristic formula of an order lower than that of the first characteristic formula.

4. The distortion compensation device according to claim 1, wherein the first distortion compensation circuit outputs an output signal having a first frequency bandwidth, and the second distortion compensation circuit outputs an output signal having a second frequency bandwidth narrower than the first frequency bandwidth.

5. The distortion compensation device according to claim 1, wherein the update unit includes a first update unit configured to update the first distortion compensation characteristic, and a second update unit configured to update the second distortion compensation characteristic, the first update unit updates the first distortion compensation characteristic on the basis of a first monitoring signal obtained from the output signal of the amplifier, the second update unit updates the second distortion compensation characteristic on the basis of a second monitoring signal obtained from the output signal of the amplifier, and a frequency bandwidth of the second monitoring signal is narrower than a frequency bandwidth of the first monitoring signal.

6. A wireless communicator comprising:

an amplifier configured to amplify a signal having a radio frequency;

a first distortion compensation circuit having a first distortion compensation characteristic for compensating for a first distortion occurring in an output of the amplifier, the first distortion compensation circuit being configured to compensate for the first distortion;

a second distortion compensation circuit having a second distortion compensation characteristic for compensating for a second distortion occurring in the output of the amplifier, the second distortion compensation circuit being configured to compensate for the second distortion; and an update unit configured to update the second distortion compensation characteristic, wherein the first distortion includes a non-linear distortion and a memory effect distortion, the second distortion is a distortion whose temporal change is quicker than the first distortion, and the update unit updates the second distortion compensation characteristic at a higher frequency than an update frequency of the first distortion compensation characteristic.

7. The wireless communicator according to claim 6, further comprising:

a first filter configured to convert a monitoring signal obtained from the output signal of the amplifier, to a first monitoring signal; and a second filter configured to convert the monitoring signal to a second monitoring signal whose frequency bandwidth is narrower than that of the first monitoring signal, wherein the update unit includes a first update unit configured to update the first distortion compensation characteristic on the basis of the first monitoring signal outputted from the first filter, and a second update unit configured to update the second distortion compensation characteristic on the basis of the second monitoring signal outputted from the second filter.

8. A predistorter connected to an external distortion compensation circuit configured to compensate for a first distortion occurring in an output of an amplifier, the predistorter comprising:

a distortion compensation circuit having a distortion compensation characteristic for compensating for, out of distortions occurring in the output of the amplifier, a second distortion different from the first distortion; and an update unit configured to update the distortion compensation characteristic, wherein the first distortion includes a non-linear distortion and a memory effect distortion, the second distortion is a distortion whose temporal change is quicker than the first distortion, and the update unit updates the distortion compensation characteristic at a higher frequency than an update frequency of the external distortion compensation circuit.

* * * * *